(12) United States Patent
Baba et al.

(10) Patent No.: US 9,847,237 B2
(45) Date of Patent: Dec. 19, 2017

(54) METHOD AND APPARATUS FOR MANUFACTURING SEMICONDUCTOR MODULE

(71) Applicant: TOYOTA JIDOSHA KABUSHIKI KAISHA, Toyota-shi, Aichi (JP)

(72) Inventors: Youichiro Baba, Miyoshi (JP); Takayasu Hikida, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 326 days.

(21) Appl. No.: 14/630,010

(22) Filed: Feb. 24, 2015

(65) Prior Publication Data

US 2015/0243532 A1 Aug. 27, 2015

(30) Foreign Application Priority Data

Feb. 27, 2014 (JP) .................................. 2014-37299

(51) Int. Cl.
*B29C 45/02* (2006.01)
*H01L 21/56* (2006.01)
(Continued)

(52) U.S. Cl.
CPC ............ *H01L 21/565* (2013.01); *B29C 45/02* (2013.01); *B29C 45/14262* (2013.01);
(Continued)

(58) Field of Classification Search
CPC ....... H01L 21/565; H01L 24/40; H01L 24/36; H01L 21/67126; H01L 23/3107;
(Continued)

(56) References Cited

U.S. PATENT DOCUMENTS 4,066,189 A * 1/1978 Toyoaki ................. B22D 17/32
164/155.5
4,554,126 A * 11/1985 Sera ........................ B29C 45/02
257/E21.504
(Continued)

FOREIGN PATENT DOCUMENTS

EP 2 082 858 A1 7/2009
JP S63-11530 U 5/1988
(Continued)

*Primary Examiner* — Jeffrey M Wollschlager
(74) *Attorney, Agent, or Firm* — Oliff PLC

(57) ABSTRACT

Disclosed is a technique capable of preventing an encapsulating material from covering a heat-dissipating surface of a semiconductor module, which releases heat of a switching element. Specifically disclosed is a step for manufacturing a semiconductor module including a submodule having a collector and an emitter with heat-dissipating surfaces, including a step for placing the submodule in the cavity so that the submodule is pressed by the pressing device while covering the heat-dissipating surface of the emitter with the pressing device and covering the heat-dissipating surface of the collector with the lower mold, and a step for feeding the encapsulating material to the cavity by moving the piston so that the pressure of the cavity measured by the pressure measuring device does not exceed the pressure at which the pressing device presses the submodule.

6 Claims, 16 Drawing Sheets

(51) Int. Cl.
*H01L 21/67* (2006.01)
*H01L 23/00* (2006.01)
*B29C 45/14* (2006.01)
*H01L 21/66* (2006.01)
*B29C 33/42* (2006.01)
*B29C 33/00* (2006.01)
*B29C 45/00* (2006.01)
*H01L 23/31* (2006.01)

(52) U.S. Cl.
CPC ........ *H01L 21/67126* (2013.01); *H01L 24/36* (2013.01); *H01L 24/40* (2013.01); *B29C 33/0022* (2013.01); *B29C 33/0038* (2013.01); *B29C 45/0046* (2013.01); *B29C 2033/0094* (2013.01); *B29C 2033/422* (2013.01); *B29C 2045/0049* (2013.01); *H01L 22/10* (2013.01); *H01L 23/3107* (2013.01); *H01L 2224/40137* (2013.01); *H01L 2224/40245* (2013.01); *H01L 2224/48091* (2013.01); *H01L 2224/48247* (2013.01); *H01L 2924/13055* (2013.01); *H01L 2924/181* (2013.01)

(58) Field of Classification Search
CPC . H01L 2924/13055; H01L 2224/40245; H01L 2224/40137; H01L 2924/181; H01L 2224/48247; H01L 2224/48091; H01L 22/10; B29C 33/0038; B29C 33/0044; B29C 2033/0094; B29C 33/12; B29C 45/0046; B29C 2045/0049; B29C 45/02; B29C 45/14262
USPC .................................................. 264/275, 276
See application file for complete search history.

(56) References Cited

U.S. PATENT DOCUMENTS

| | | | | |
|---|---|---|---|---|
| 4,680,617 A * | 7/1987 | Ross | ........................ | B29C 43/18 174/530 |
| 4,781,879 A * | 11/1988 | Oishi | .................. | B29C 45/0025 264/328.12 |
| 5,178,815 A * | 1/1993 | Yokote | .................. | B29C 43/146 264/259 |
| 5,766,650 A * | 6/1998 | Peters | ............... | B29C 45/14418 249/93 |
| 6,554,598 B1 * | 4/2003 | Tsuruta | .................. | H01L 21/565 257/E21.504 |
| 6,770,236 B2 * | 8/2004 | Miyajima | ......... | H01L 21/67126 264/102 |
| 7,839,004 B2 * | 11/2010 | Sakai | .................. | B29C 45/0046 257/666 |
| 8,163,220 B2 * | 4/2012 | Hundt | .................. | H01L 21/565 264/272.15 |
| 2001/0033477 A1 | 10/2001 | Inoue et al. | | |
| 2002/0093120 A1 * | 7/2002 | Magni | .................. | H01L 21/565 264/272.15 |
| 2003/0090873 A1 | 5/2003 | Ohkouchi | | |
| 2003/0118680 A1 * | 6/2003 | Lin | .................... | B29C 45/14639 425/123 |
| 2004/0144996 A1 | 7/2004 | Inoue | | |
| 2005/0040515 A1 | 2/2005 | Inoue et al. | | |
| 2006/0108700 A1 | 5/2006 | Nakazawa et al. | | |
| 2006/0120047 A1 | 6/2006 | Inoue | | |
| 2006/0232939 A1 | 10/2006 | Inoue | | |
| 2007/0296076 A1 | 12/2007 | Koike et al. | | |
| 2012/0175812 A1 * | 7/2012 | Ikeda | ...................... | B29C 33/68 264/272.13 |
| 2013/0020669 A1 * | 1/2013 | Koga | .................. | H01L 23/3114 257/433 |
| 2013/0028998 A1 * | 1/2013 | Maekawa | ............. | H01L 21/565 425/129.1 |

FOREIGN PATENT DOCUMENTS

| | | |
|---|---|---|
| JP | H03-141340 A | 6/1991 |
| JP | H08-127047 A | 5/1996 |
| JP | 2001-352023 A | 12/2001 |
| JP | 2003-011154 A | 1/2003 |
| JP | 2006-086499 A | 3/2006 |
| JP | 2006-147852 A | 6/2006 |
| JP | 2007-320102 A | 12/2007 |
| JP | 2008-016830 A | 1/2008 |
| JP | 2009-177093 A | 8/2009 |
| JP | 2010-238868 A | 10/2010 |
| JP | 2011-054623 A | 3/2011 |
| JP | 2011-151109 A | 8/2011 |
| JP | 2011-243801 A | 12/2011 |
| JP | 2012-174711 A | 9/2012 |
| JP | 2013-222714 A | 10/2013 |

* cited by examiner

METHOD AND APPARATUS FOR MANUFACTURING SEMICONDUCTOR MODULE

TECHNICAL FIELD

The present invention relates to a method and an apparatus for manufacturing a semiconductor module, particularly to a technique for encapsulating a semiconductor device with an encapsulating material.

BACKGROUND ART

Conventionally, there is a widely known semiconductor module produced by encapsulating a plurality of members, such as semiconductor devices, with an encapsulating material such as thermosetting resin. The semiconductor module is used for controlling a motor of a hybrid vehicle, for example.

The semiconductor module needs to be cooled by a predetermined cooler because the semiconductor module heats up in association with switching operation of a semiconductor device (switching element).

JP-A 2001-352023 discloses a semiconductor module includes a pair of metal plates acting as heat spreaders and electrodes, a semiconductor device arranged between the pair of metal plates, and a resin encapsulating the pair of metal plates and the semiconductor device so that the outer surface of each metal plate is exposed.

In the semiconductor module disclosed in JP-A 2001-352023, the semiconductor device is cooled by a cooler (coolant tube) being in contact with the exposed surface of each metal plate through an insulating plate.

In a step for manufacturing the semiconductor module disclosed in JP-A 2001-352023, after encapsulating the pair of metal plates and the semiconductor device with the resin, a part of the resin needs to be removed in order to expose the outer surface of each metal plate.

JP-A 2010-238868 discloses a technique for manufacturing a semiconductor module in which two heat-dissipating surfaces (surfaces to be brought into contact with coolers) are exposed without removing a part of a resin.

The technique disclosed in JP-A 2010-238868 is characterized by providing a movable member which presses one of the heat-dissipating surfaces of a workpiece (a plurality of members such as semiconductor devices) to enter into a cavity where the workpiece is arranged, a first pressure sensor for detecting pressure at which the movable member presses the workpiece, and a second sensor for detecting pressure of the resin in the cavity, and by performing feedback control based on detected values of the sensors so as to keep the pressure at which the movable member presses the workpiece constant.

According to the technique disclosed in JP-A 2010-238868, the workpiece is pressed by the movable member at constant pressure, and thereby a state can be maintained where the plurality of members constituting the workpiece are pressed against each other. Therefore, the semiconductor module can be manufactured without joining the plurality of members constituting the workpiece with joining material such as solder.

Moreover, the workpiece is pressed by the movable member at constant pressure, and thereby the two heat-dissipating surfaces of the workpiece are masked by the movable member and a metal mold even when the cavity is filled with the resin. Therefore, the semiconductor module whose heat-dissipating surfaces are exposed can be manufactured without removing a part of the resin.

However, even if the pressure at which the movable member presses the workpiece is kept constant, the metal mold may open (upper and lower molds move away from each other) due to applying load to the metal mold when the cavity is filled with the resin and the pressure of the cavity is sharply increased. As a result, there is a problem in that the heat-dissipating surfaces are covered with the resin, for example.

SUMMARY OF INVENTION

Problem to be Solved by the Invention

The objective of the present invention is to provide a technique capable of preventing an encapsulating material from covering a heat-dissipating surface of a semiconductor module, which releases heat of a switching element.

Means for Solving the Problem

A first aspect of the present invention is a method for manufacturing a semiconductor module including a submodule having at least one switching element, and at least one pair of plate-like electrodes between which the switching element is sandwiched, in which two heat-dissipating surfaces for releasing heat of the switching element are formed on two surfaces opposite to two surfaces facing the switching element in the pair of electrodes. The method includes a first step for preparing a lower mold and an upper mold between which a cavity is formed when the lower mold and the upper mold are closed, a pressing device pressing one of the two heat-dissipating surfaces, which is arranged in one of the lower mold and the upper mold, a pressure measuring device which measures a pressure of the cavity, a piston which feeds an encapsulating material for encapsulating the submodule to the cavity. The method includes a second step for placing the submodule in the cavity so that the submodule is pressed by the pressing device while covering one of the two heat-dissipating surfaces with the pressing device and covering the other of the two heat-dissipating surfaces with the other of the lower mold and the upper mold. The method includes a third step for feeding the encapsulating material to the cavity by moving the piston so that the pressure of the cavity measured by the pressure measuring device does not exceed a pressure at which the pressing device presses the submodule.

Preferably, in the third step, a velocity of the piston is reduced before the cavity is completely filled with the encapsulating material.

Preferably, the submodule has two switching elements, and two pairs of electrodes between which the switching elements are sandwiched. In the third step, the encapsulating material is fed to the cavity so as to flow from a center of the cavity toward the outside of the cavity, seen in a plan view.

Preferably, the lower mold and the upper mold have a plurality of weirs restraining the encapsulating material from flowing toward the outside of the cavity.

Preferably, the pressing device has a sliding member sliding in a direction in which the pressing device presses the submodule and closely coming in contact with one of the two heat-dissipating surfaces, and an elastic member forcing the sliding member in the direction in which the pressing device presses the submodule.

Preferably, the pressing device has an elastic member closely coming in contact with an outer edge of one of the two heat-dissipating surfaces.

Preferably, the pressing device has a sheet-like elastic member closely coming in contact with one of the two heat-dissipating surfaces.

A second aspect of the present invention is an apparatus for manufacturing a semiconductor module including a submodule having at least one switching element, and at least one pair of plate-like electrodes between which the switching element is sandwiched, in which two heat-dissipating surfaces for releasing heat of the switching element are formed on two surfaces opposite to two surfaces facing the switching element in the pair of electrodes. The apparatus includes a lower mold and an upper mold between which a cavity is formed when the lower mold and the upper mold are closed, the cavity being a space in which the submodule is placed, a pressing device pressing one of the two heat-dissipating surfaces, which is arranged in one of the lower mold and the upper mold, a pressure measuring device which measures a pressure of the cavity, a piston which feeds an encapsulating material for encapsulating the submodule to the cavity, and a controller which controls the piston based on the pressure of the cavity measured by the pressure measuring device. The other of the lower mold and the upper mold closely comes in contact with the other of the two heat-dissipating surfaces when the lower mold and the upper mold are closed. The pressing device presses the submodule while covering one of the two heat-dissipating surfaces when the lower mold and the upper mold are closed. The controller moves the piston so that the pressure of the cavity measured by the pressure measuring device does not exceed a pressure at which the pressing device presses the submodule.

Preferably, the controller reduces a velocity of the piston before the cavity is completely filled with the encapsulating material.

Preferably, the submodule has two switching elements, and two pairs of electrodes between which the switching elements are sandwiched. A gate hole acting as a hole through which the encapsulating material is fed to the cavity is formed in a center of the cavity, seen in a plan view.

Preferably, the lower mold and the upper mold have a plurality of weirs restraining the encapsulating material from flowing toward the outside of the cavity.

Preferably, the pressing device has a sliding member sliding in a direction in which the pressing device presses the submodule and closely coming in contact with one of the two heat-dissipating surfaces, and an elastic member forcing the sliding member in the direction in which the pressing device presses the submodule.

Preferably, the pressing device has an elastic member closely coming in contact with an outer edge of one of the two heat-dissipating surfaces.

Preferably, the pressing device has a sheet-like elastic member closely coming in contact with one of the two heat-dissipating surfaces.

Effects of the Invention

The present invention makes it possible to prevent an encapsulating material from covering a heat-dissipating surface of a semiconductor module, which releases heat of a switching element.

DESCRIPTION OF EMBODIMENTS

[First Embodiment]

Described below is an apparatus 100 for manufacturing a semiconductor module 1000, as a first embodiment of an apparatus for manufacturing a semiconductor module according to the present invention.

Figure 1A:
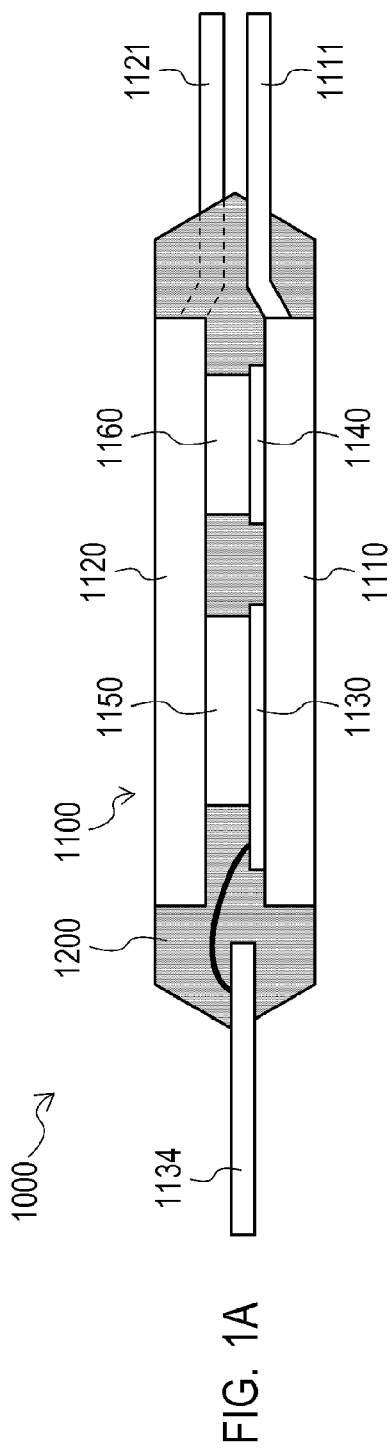
FIGS. 1A and 1B shows a submodule according to a first embodiment of the present invention.
Figure 1B:
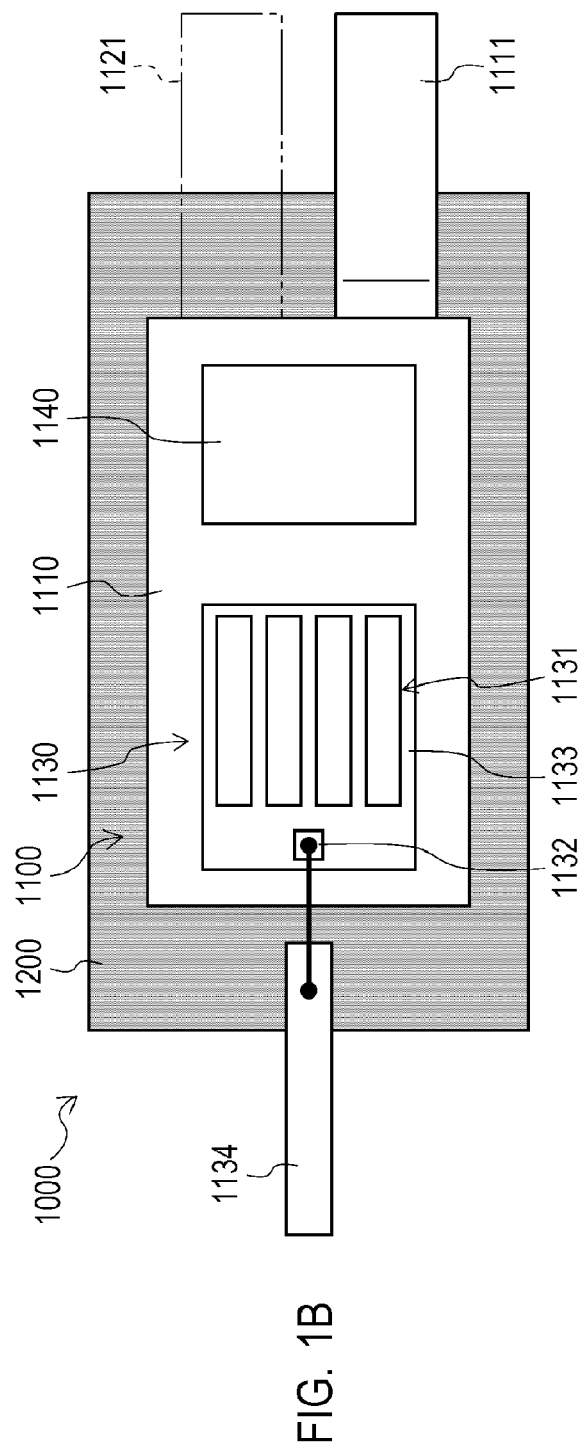

First, with reference to FIGS. 1A and 1B, the structure of the semiconductor module 1000 is described.

The semiconductor module 1000 is what is called a 1-in-1 type intelligent power module. The semiconductor module 1000 is used for controlling a motor of a hybrid vehicle, for example.

As shown in FIGS. 1A and 1B, the semiconductor module 1000 includes a submodule 1100 and an encapsulating part 1200.

The submodule 1100 consists of a plurality of members, and is encapsulated by the encapsulating part 1200. In other words, the submodule 1100 corresponds to the part of the semiconductor module 1000 other than the encapsulating part 1200.

The submodule 1100 has a collector 1110, an emitter 1120, a transistor 1130, a diode 1140, a first spacer 1150, and a second spacer 1160.

The collector 1110 and the emitter 1120 act as heat spreaders and a pair of electrodes. Each of the collector 110 and the emitter 1120 is made of metal such as copper, and is formed in a plate having a constant thickness (vertical length in FIG. 1A). The collector 1110 and the emitter 1120 are arranged at a predetermined interval so that one plate-surface of the collector 1110 and one plate-surface of the emitter 1120 face in parallel with each other. The collector 1110 and the emitter 1120 have a collector terminal 1111 and an emitter terminal 1121 for electrically connecting the collector 1110 and the emitter 1120 to the outside, respectively. The collector terminal 11 and the emitter terminal 1121 protrude outward of the encapsulating part 1200.

On the one plate-surface (surface facing the emitter 1120) of the collector 1110, the transistor 1130 and the diode 1140 are mounted at a predetermined interval. In other words, the transistor 1130 and the diode 1140 are arranged between the collector 1110 and the emitter 1120.

The transistor 1130 is a semiconductor device acting as a switching element such as an insulated-gate bipolar transistor (IGBT). The transistor 1130 is formed in a thin plate. On one plate-surface of the transistor 1130, an emitter electrode 1131 and a gate electrode 1132 are formed. On the other plate-surface of the transistor 1130, a collector electrode (not shown) is formed. The transistor 1130 is joined to the collector 1110 with joining material such as solder with the collector electrode in contact with the one plate-surface of the collector 1110.

The one plate-surface of the transistor 1130 is coated with an insulating film 1133 made of an insulant such as silicon oxide. The insulating film 1133 is not formed on a part of the one plate-surface of the transistor 1130, where the emitter electrode 1131 and the gate electrode 1132 are formed. In other words, the emitter electrode 1131 and the gate electrode 1132 are exposed.

The emitter electrode 1131 is electrically connected to the emitter 1120 through the first spacer 1150.

The first spacer 1150 is made of metal such as copper, and is formed in substantially a rectangular cuboid. The first spacer 1150 is joined to the transistor 1130 with joining material such as solder with one surface of the first spacer 1150 in contact with the emitter electrode 1131 of the transistor 1130. Moreover, the first spacer 1150 is joined to the emitter 1120 with joining material such as solder with a surface (surface in contact with the emitter electrode 1131) opposite to the one surface of the first spacer 1150 being in contact with the emitter 1120. In this manner, the first spacer 1150 is arranged between the collector 1110 and the emitter 1120 so that the collector 1110 and the emitter 1120 come out of contact with each other.

The gate electrode 1132 is electrically connected to a gate terminal 1134 through a bonding wire.

The gate terminal 1134 is a member for electrically connecting with the outside. The gate terminal 1134 protrudes outward of the encapsulating part 1200 in a direction opposite to a direction in which the collector terminal 1111 and the emitter terminal 1121 protrude. The gate terminal 1134 is arranged to come out of contact with the collector 1110, the emitter 1120, the transistor 1130, the diode 1140, the first spacer 1150 and the second spacer 1160.

The diode 1140 is a semiconductor device such as a fast recovery diode (FRD). The diode 1140 is formed in a thin plate. One plate-surface of the diode 1140 acts as an anode, and the other plate surface of the diode 1140 acts as a cathode. The diode 1140 is joined to the collector 1110 with solder with the surface acting as the cathode being contact with the one plate-surface (surface facing the emitter 1120) of the collector 1110. The surface of the diode 1140 acting as the anode is electrically connected to the emitter 1120 through the second spacer 1160.

The second spacer 1160 is substantially similar in structure to the first spacer 1150. The second spacer 1160 is made of metal such as copper, and is formed in substantially a rectangular cuboid. The second spacer 1160 is joined to the diode 1140 with solder with one surface of the second spacer 1160 in contact with the surface of the diode 1140 acting as the anode. Moreover, the second spacer 1160 is joined to the emitter 1120 with solder with a surface (surface in contact with the diode 1140) opposite to the one surface of the second spacer 1160 being in contact with the emitter 1120. In this manner, the second spacer 1160 is, similarly to the first spacer 1150, arranged between the collector 1110 and the emitter 1120 so that the collector 1110 and the emitter 1120 come out of contact with each other.

The encapsulating part 1200 is made by curing a resin R (see FIG. 2) as an encapsulating material and then removing an unnecessary part thereof. In the present embodiment, the resin R is an epoxy resin which is a thermosetting resin.

The encapsulating part 1200 encapsulates the submodule 1100. Specifically, the encapsulating part 1200 holds the submodule 1100 thereinside so that the other plate-surfaces (plate-surfaces situated outside) of the collector 1110 and the emitter 1120 are exposed, and that the tips of the collector terminal 1111, the emitter terminal 1121 and the gate terminal 1134 are exposed.

The semiconductor module 1000 configured as mentioned above is cooled by bringing the other plate-surfaces of the collector 1110 and the emitter 1120, which are exposed outside of the encapsulating part 1200 into contact with coolers through predetermined insulators (e.g., thin ceramic plates). In other words, in the semiconductor module 1000, the other plate-surfaces of the collector 1110 and the emitter 1120 act as heat-dissipating surfaces which releases heat of switching elements (the transistor 1130 and the diode 1140).

In the present embodiment, the transistor 1130 and the diode 1140 each of which is a semiconductor device are provided. A semiconductor device (the transistor 1130) acting as a switching element is at least required to be provided.

Figure 2:
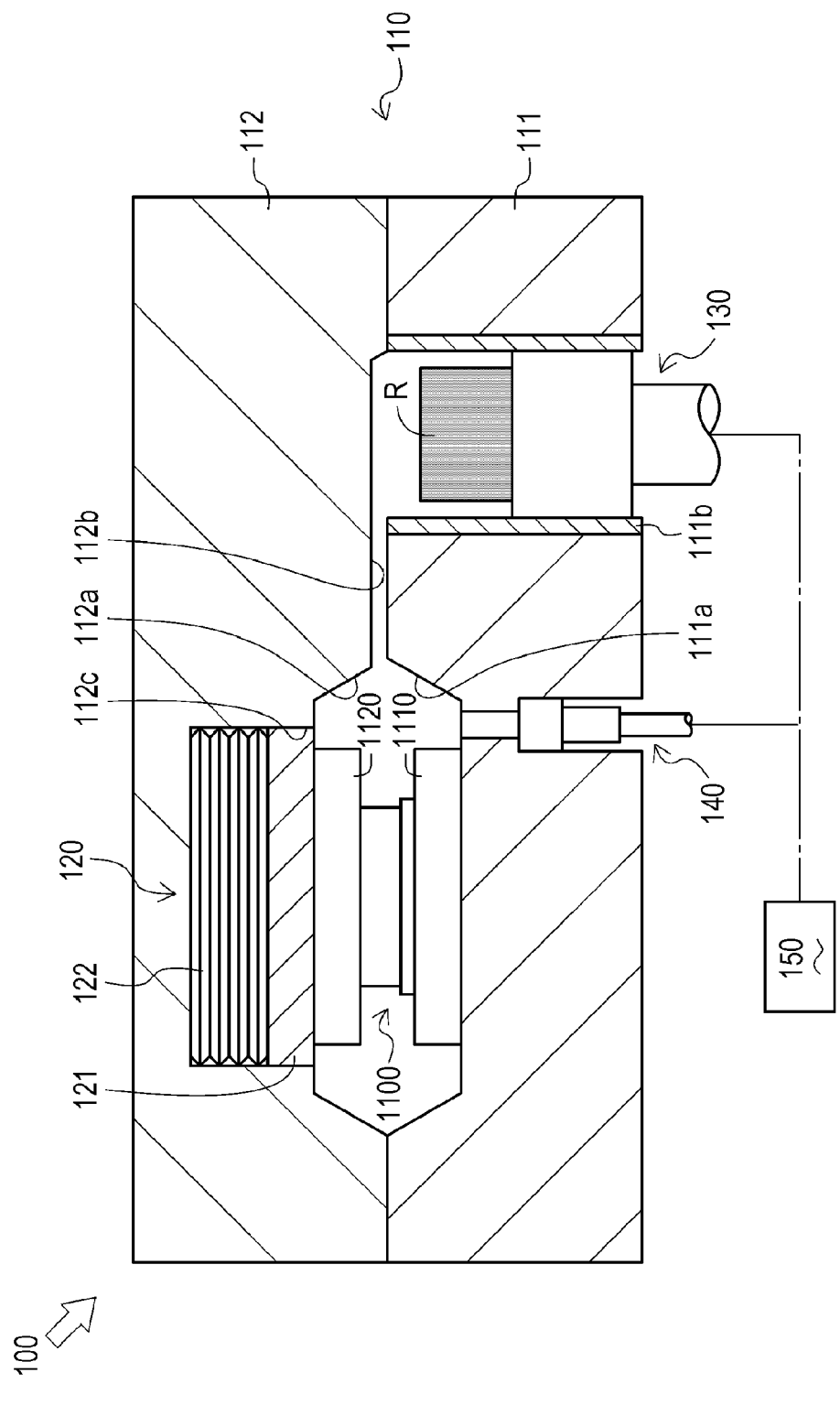
FIG. 2 shows an apparatus for manufacturing a semiconductor module according to the first embodiment of the present invention.

Next, with reference to FIG. 2, the structure of the apparatus 100 is described.

The apparatus 100 manufactures the semiconductor module 1000.

For convenience, the vertical direction in FIG. 2 is defined as a vertical direction of the apparatus 100, and the horizontal direction in FIG. 2 is defined as a horizontal direction of the apparatus 100.

As shown in FIG. 2, the apparatus 100 includes a metal mold 110, a pressing device 120, a piston 130, a pressure sensor 140, and a controller 150.

The metal mold 110 consists of a lower mold 111 and an upper mold 112. When the metal mold 110 is closed (when the lower mold 111 and the upper mold 112 come in contact with each other), a cavity which is a space for molding the encapsulating part 1200 of the semiconductor module 1000 is formed inside the metal mold 110. The cavity of the metal mold 110 is situated in the left portion inside the metal mold 110. The cavity of the metal mold 110 has a vertical length substantially equal to that of the submodule 100. The submodule 1100 is arranged in the cavity of the metal mold 110, and then the resin R is fed to the cavity.

The lower mold 111 constitutes the lower part of the metal mold 110, and is fixed at a predetermined position. Inside the lower mold 111, a heater (not shown) for heating the lower mold 111 is arranged. On the upper surface of the lower mold 111, a recess 11a is formed which constitutes the lower portion of the cavity of the metal mold 110.

The recess 111a is formed so that the left portion of the upper surface of the lower mold 111 dents downward. The bottom surface (lower surface) of the recess 111a is formed as a flat surface extending in the horizontal direction. On the bottom surface of the recess 111a, the submodule 1100 is placed so that the bottom surface and the heat-dissipating surface (lower end surface) of the collector 1110 closely come in contact with each other.

Inside the lower mold 111, a cylinder 111*b* is arranged. Specifically, in the right portion of the lower mold 111, a cylindrical through-hole penetrating through the lower mold 111 in the vertical direction is formed at a predetermined interval between the through-hole and the recess 111*a*. The cylinder 111*b* is fitted into the through-hole.

The cylinder 111*b* is a member formed in a circular cylinder. Inside the cylinder 111*b*, the piston 130 is arranged in a slidable manner. The structure of the piston 130 is described later.

The upper mold 112 constitutes the upper part of the metal mold 110, and is configured to move into and out of proximity with the lower mold 111. Inside the upper mold 112, a heater (not shown) for heating the upper mold 112 is arranged. On the lower surface of the upper mold 112, a recess 112*a* is formed which constitutes the upper portion of the cavity of the metal mold 110.

The recess 112*a* is formed so that the left portion of the lower surface of the upper mold 112 dents upward. In other words, the recess 112*a* is formed to coincide in position with the recess 111*a* of the lower mold 111.

On the lower surface of the upper mold 112, a groove 112*b* for feeding the resin R to the cavity of the metal mold 110 is formed.

The groove 112*b* is formed from the right portion of the lower surface of the upper mold 112 to the recess 112*a*. Specifically, when the metal mold 110 is closed, the groove 112*b* is formed so that the inside of the cylinder 111*b* and the cavity of the metal mold 110 communicate with each other. In other words, the cavity which is a space inside the metal mold 110 and the outside of the metal mold 110 communicate with each other through the groove 112*b* and the cylinder 111*b*.

On the bottom surface (upper surface) of the recess 112*a* of the upper mold 112, a pocket 112*c* accommodating the pressing device 120 is formed.

The pocket 112*c* is formed so that the bottom surface of the recess 112*a* dents upward. The pocket 112*c* is formed to coincide in position with the submodule 1100 placed in the cavity of the metal mold 110. When seen in a plan view, the pocket 112*c* has size larger than the heat-dissipating surface (upper end surface) of the emitter 1120. In the pocket 112*c*, the pressing device 120 is arranged.

The pressing device 120 is an embodiment of a pressing device according to the present invention. The pressing device 120 presses the submodule 1100 placed in the cavity of the metal mold 110 at a predetermined pressure from above. The pressing device 120 has a sliding member 121 and an elastic member 122.

The sliding member 121 is a plate having a planar shape similar to that of the pocket 112*c*. The sliding member 121 is configured to slide in the vertical direction inside the pocket 112*c*. In other words, the sliding member 121 is configured so that the resin R fed to the cavity does not enter the pocket 112*c*. When seen in a plan view, the sliding member 121 has size larger than the heat-dissipating surface (upper end surface) of the emitter 1120. In other words, when seen in a plan view, the sliding member 121 is formed to entirely cover the heat-dissipating surface of the emitter 1120.

Two plate-surfaces (upper and lower end surfaces) of the sliding member 121 are formed as flat surfaces, and are parallel with each other. In other words, the sliding member 121 is formed as a plate having a constant thickness (vertical length). The sliding member 121 is arranged in the pocket 112*c* so that the plate-surfaces of the sliding member 121 are parallel with the horizontal direction.

The elastic member 122 forces the sliding member 121 downward. In the present embodiment, the elastic member 122 consists of a plurality of disk springs, but the structure of the elastic member 122 is not limited thereto.

In the pressing device 120 configured in this manner, since the elastic member 122 forces the sliding member 121 downward, the sliding member 121 downward presses the submodule 1100 placed in the cavity of the metal mold 110 when the metal mold 110 is closed. In other words, when the metal mold 110 is closed, the pressing device 120 presses the submodule 1100 at a predetermined pressure from above with the lower end surface of the sliding member 121 being closely contact with the heat-dissipating surface of the emitter 1120.

A pressure at which the pressing device 120 presses the submodule 1100 is set to such a value that semiconductor devices (the transistor 1130 and the diode 1140) of the submodule 1100 are not damaged.

In the present embodiment, the pressing device 120 is arranged in the upper mold 112, but may be arranged in the lower mold 111.

The piston 130 is a member for feeding the resin R to the cavity of the metal mold 110. The piston 130 slides in the vertical direction inside the cylinder 111*b*. The piston 130 is electrically connected to the controller 150, and is controlled by the controller 150. Specifically, the piston 130 is operated by a servo motor, and the servo motor is controlled by the controller 150.

On the upper end surface of the piston 130, the tablet-shaped resin R is placed. When the piston 130 is upward moved to a predetermined position while the tablet-shaped resin R is heated so as to flow, the molten resin R is fed to the cavity of the metal mold 110 through the groove 112*b*.

The pressure sensor 140 is an embodiment of a pressure measuring device according to the present invention, and is used for measuring a pressure of the cavity of the metal mold 110. The pressure sensor 140 is arranged inside the lower mold 111 so as to be exposed from the portion of the bottom surface (lower surface) of the recess 111*a*, where the submodule 1100 is not placed. The pressure sensor 140 is electrically connected to the controller 150.

The controller 150 is electrically connected to the piston 130 and the pressure sensor 140. The controller 150 controls the piston 130 based on the pressure of the cavity measured by the pressure sensor 140. In other words, the controller 150 controls the piston 130 so that the pressure of the cavity is a predetermined value. Details of how the controller 150 operates are described later.

With reference to FIGS. 3 to 7, described below is a step for manufacturing the semiconductor module 1000, as a first embodiment of a method for manufacturing a semiconductor module according to the present invention.

The step for manufacturing the semiconductor module 1000 includes manufacturing the semiconductor module 1000 by use of the apparatus 100.

Figure 3:
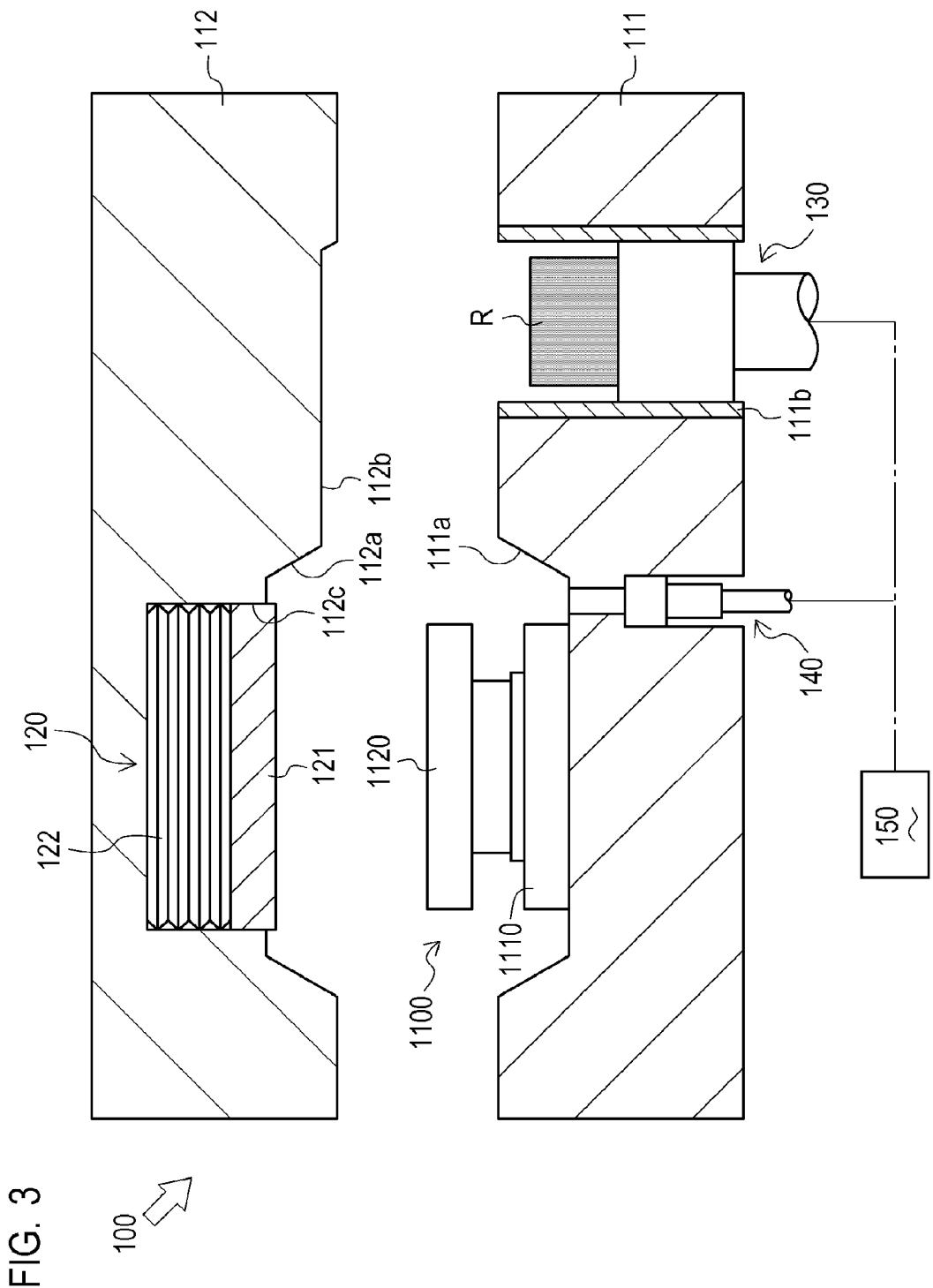
FIG. 3 shows a situation where a metal mold of the apparatus opens.

First, as shown in FIG. 3, in the step for manufacturing the semiconductor module 1000, the upper mold 112 is moved away from the lower mold 11.

At this time, the lower mold 111 and the upper mold 112 is heated by the heaters arranged therein to such a temperature (e.g., 150 to 200° C.) that the tablet-shaped resin R is molten and that the molten resin R is cured with time.

Next, the submodule 1100 is placed on the recess 111*a* so that the heat-dissipating surface (lower end surface) of the collector 1110 closely comes in contact with the bottom surface (lower surface) of the recess 111a of the lower mold 111.

At this time the submodule 1100 is heated to temperature of the lower mold 111 and the upper mold 112 in view of variation in size of the submodule 1100 by thermal expansion.

Then, in a state where the piston 130 is at the lowest position, the tablet-shaped resin R is placed on the upper end surface of the piston 130.

At this time, the tablet-shaped resin R is heated to a temperature (e.g., 90° C.) at which the tablet-shaped resin R is soften so as to be held.

Figure 4:
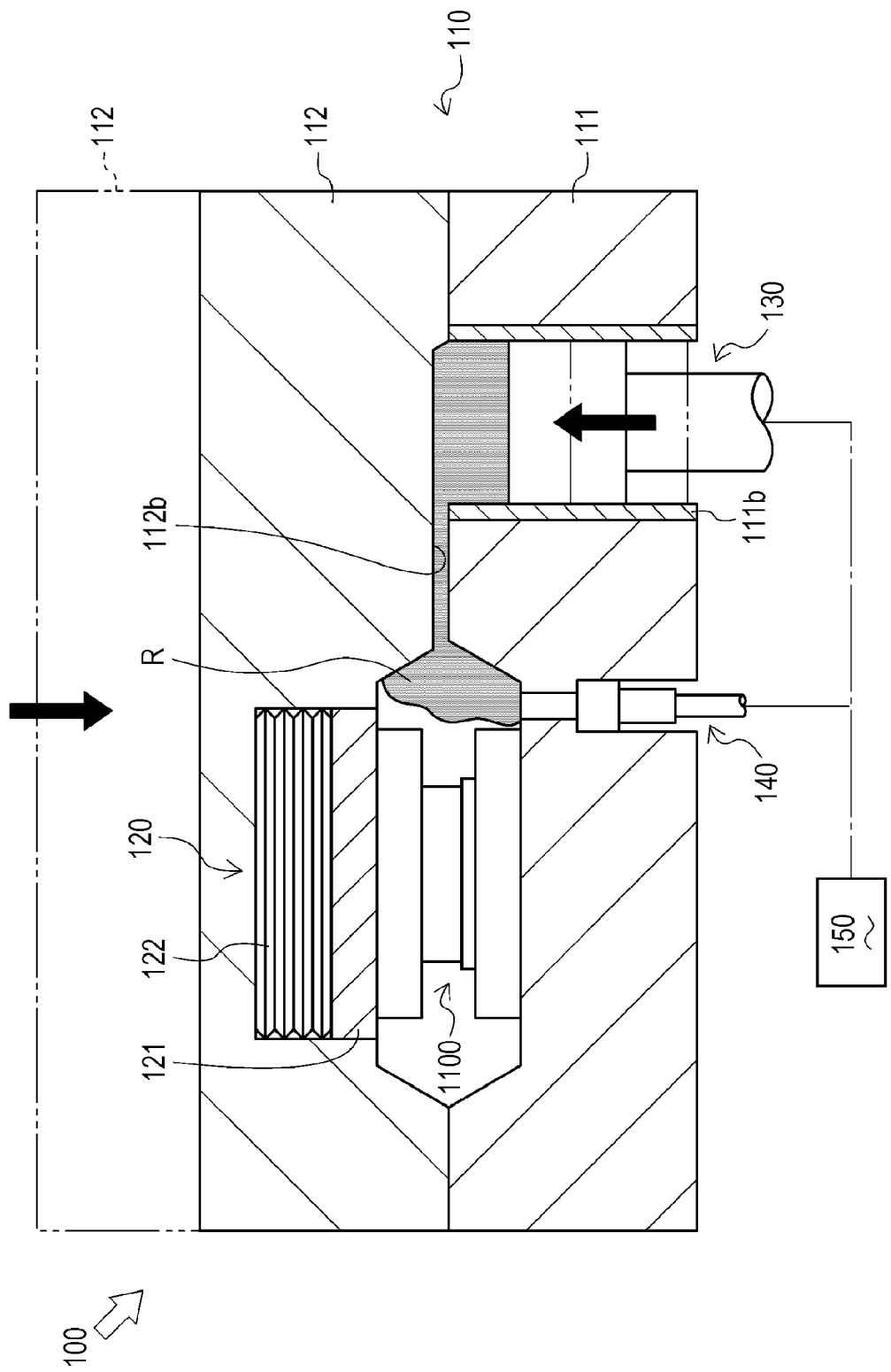
FIG. 4 shows how to feed an encapsulating material into a cavity of the metal mold of the apparatus.

Then, as shown in FIG. 4, the upper mold 112 is downward moved until the lower surface of the upper mold 112 comes in contact with the upper surface of the lower mold 111, and thereby the metal mold 110 is closed.

At this time, the lower end surface of the sliding member 121 of the pressing device 120 closely comes in contact with the heat-dissipating surface (upper end surface) of the emitter 1120, and the sliding member 121 presses the submodule 1100 downward. In other words, the submodule 1100 is sandwiched between the sliding member 121 of the pressing device 120 and the recess 111a of the lower mold 11 from above and below, and thereby the heat-dissipating surface of the collector 1110 and the heat-dissipating surface of the emitter 1120 are entirely masked by the bottom surface of the recess 111a and the lower end surface of the sliding member 121, respectively.

Then, when the piston 130 is upward moved, the softened tablet-shaped resin R comes in contact with the upper mold 112 and melts.

At this time, the molten resin R is fed to the cavity of the metal mold 110 through the groove 112b.

As mentioned previously, the tablet-shaped resin R is previously softened, which enables the resin R to suitably flow so as to be fed to the cavity of the metal mold 110 even if the thrust of the piston 130 becomes low.

Figure 5:
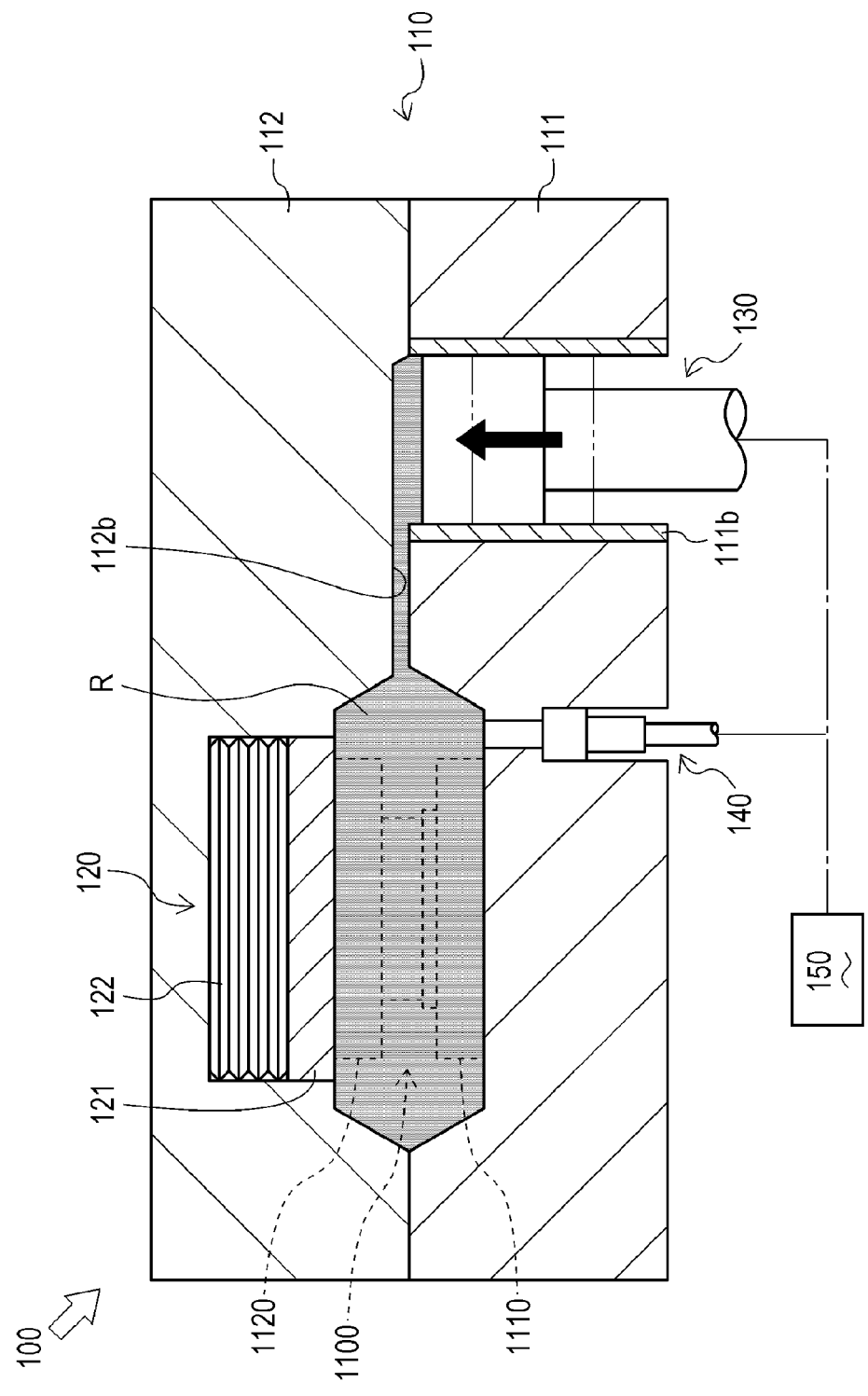
FIG. 5 shows a situation where the cavity is filled with the encapsulating material.

As show in FIG. 5, the piston 130 is further upward moved to fill the cavity of the metal mold 110 with the resin R.

Figure 6:
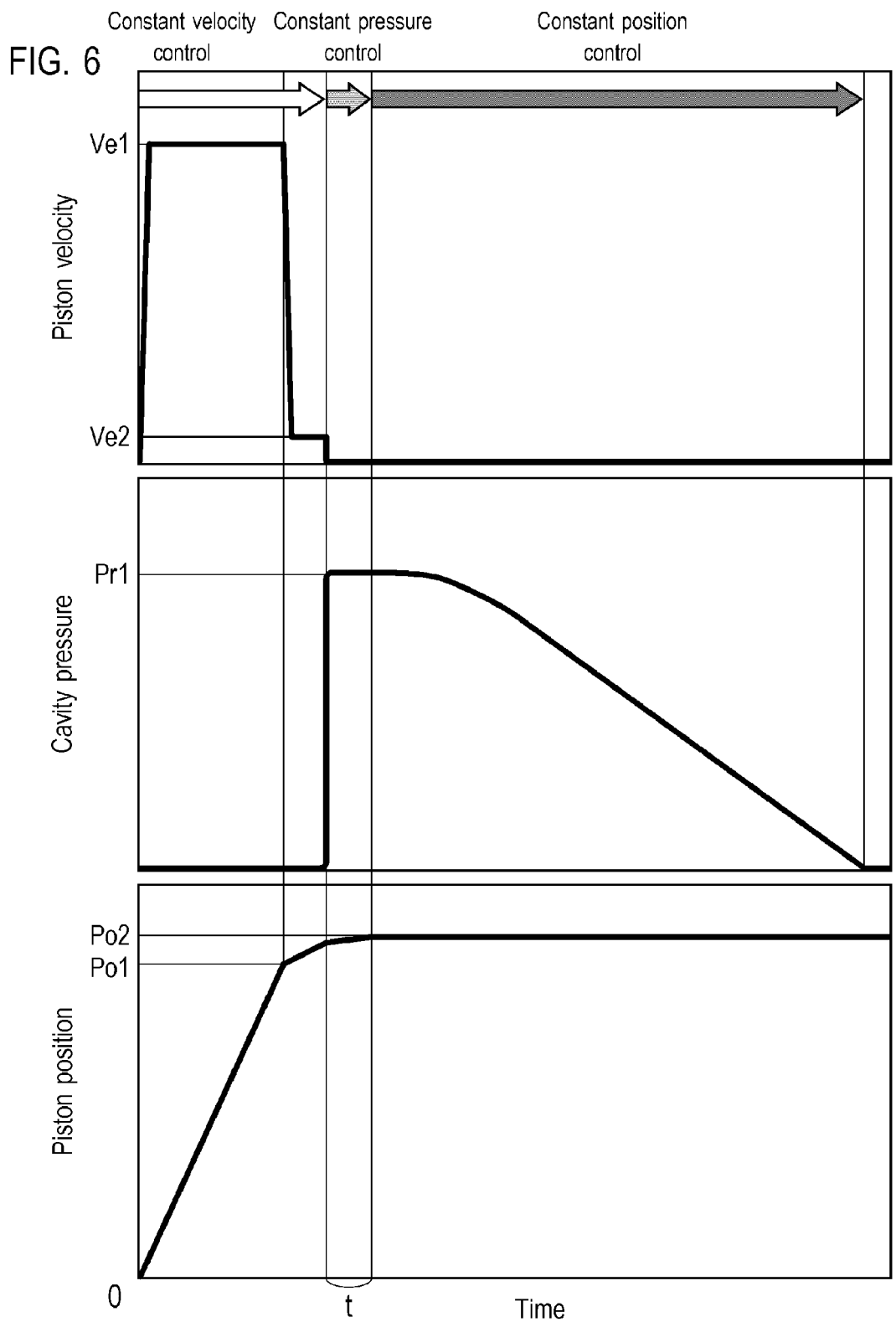
FIG. 6 shows sequential control by a controller of the semiconductor module.

With reference to FIG. 6, details of how the controller 150 operates are described below.

FIG. 6 shows sequential control by the controller 150. FIG. 6 shows a relationship between an elapsed time and a velocity of the piston 130, a relationship between the elapsed time and the pressure of the cavity of the metal mold 110, and a relationship between the elapsed time and the position of the piston 130.

First, as show in FIG. 6, the controller 150 moves the piston 130 upward at a velocity Ve1.

At this time, since the piston 130 moves upward at a constant velocity of the velocity Ve1, a constant quantity of resin R per unit of time is fed to the cavity of the metal mold 110.

Since the cavity of the metal mold 110 is not completely filled with the resin R, a value (pressure of the cavity) measured by the pressure sensor 140 does not change.

Next, the controller 150 reduces the velocity of the piston 130 to a velocity Ve2 when the piston 130 reaches a position Po1.

Note that the position Po1 is such a position that a proportion of the resin R to the cavity of the metal mold 110 is 90%.

Note that the velocity Ve2 is set to one tenth of the velocity Ve1, for example.

At this time, since the piston 130 moves upward at a constant velocity of the velocity Ve2, a constant quantity of resin R per unit of time is fed to the cavity of the metal mold 110. However, a quantity of the supplied resin R per unit of time is smaller than that for the case where the piston 130 moves upward at the velocity Ve1.

Since the cavity of the metal mold 110 is not completely filled with the resin R, the value (pressure of the cavity) measured by the pressure sensor 140 does not change. When the piston 130 moves further upward and the cavity of the metal mold 110 is completely filled with the resin R, the pressure of the cavity is increased by the thrust of the piston 130.

In this manner, in the apparatus 100, since the pressure of the cavity is measured by the pressure sensor 140, it may be determined that the cavity of the metal mold 110 is not completely filled with the resin R if the value (pressure of the cavity) measured by the pressure sensor 140 does not change after the measurement of the value begins. This makes it possible to prevent the cavity of the metal mold 110 from being not completely filled with the resin R.

Then, when the value (pressure of the cavity) measured by the pressure sensor 140 reaches a pressure Pr1, the controller 150 stops the piston 130 from moving upward at the velocity Ve2, and controls the piston 130 so that the pressure of the cavity maintains the pressure Pr1 for a time t. Specifically, since the resin R gels and slightly shrinks with time, the controller 150 moves the piston 130 upward according to shrinkage of the resin R.

At this time, before the pressure of the cavity begins to increase, the velocity of the piston 130 is reduced to the velocity Ve2. This makes it possible to prevent the pressure of the cavity from sharply increasing, and consequently to prevent the pressure of the cavity from exceeding the pressure Pr1.

Note that the pressure Pr1 is set to such a value that the sliding member 121 of the pressing device 120 does not move upward by the pressure of the resin R. In other words, the pressure Pr1 is set to a value smaller than the pressure at which the pressing device 120 presses the submodule 1100. This makes it possible to prevent the sliding member 121 from being pressed up by the resin R, and consequently to prevent the heat-dissipating surface of the collector 1110 and the heat-dissipating surface of the emitter 1120 from being covered with the resin R. Moreover, this makes it possible to prevent the collector 1110 and the emitter 1120 from being moved away from each other by the resin R, and consequently to prevent the semiconductor devices (the transistor 1130 and the diode 1140) from being damaged.

Note that the time t is set based on cure rate of the resin R. In other words, the time t is set depending on a kind of the resin R.

After a lapse of the time t, the piston 130 reaches a position Po2.

Finally, the controller 150 holds the piston 130 at the position Po2 until the resin R completely cures.

As the resin R cures and shrinks, the value (pressure of the cavity) measured by the pressure sensor 140 decreases. Therefore, it may be determined that the resin R completely cures when the pressure of the cavity returns to atmospheric pressure.

As mentioned above, first, as a first stage, the controller 150 controls the piston 130 to make the velocity of the piston 130 constant (velocity Ve1 and velocity Ve2). Next, when the pressure of the cavity reaches the pressure Pr1, as a second stage, the controller 150 controls the piston 130 to make the pressure of the cavity constant (pressure Pr1).

Finally, after a lapse of the time t, as a third stage, the controller 150 controls the piston 130 to make the position of the piston 130 constant (position Po2).

In this manner, in the apparatus 100, the controller 150 controls the piston 130 which supplies the resin R bringing the increase of the pressure of the cavity so that the pressure of the cavity measured by the pressure sensor 140 does not exceed the pressure at which the pressing device 120 presses the submodule 1100. This makes it possible to prevent occurrence of a problem in that the metal mold opens due to sharp increase in pressure of the cavity as in a conventional technique (e.g., JP-A 2010-238868) in which a quantity of a resin fed to the cavity is not controlled. In particular, it is possible to reliably prevent sharp increase in pressure of the cavity because the velocity of the piston is reduced before the pressure of the cavity increases, namely, before the cavity is completely filled with the resin.

Therefore, it is possible to prevent the heat-dissipating surface for releasing heat of the semiconductor device from being covered with the resin. In addition, it is possible to prevent the resin from being excessively fed to the cavity of the metal mold.

Moreover, the apparatus 100 has a simple structure in which the pressing device 120 having no controlling mechanism is provided and the controller 150 only controls the piston 130. This makes it possible to prevent the heat-dissipating surface for releasing heat of the semiconductor device from being covered with the resin.

Note that the manner of the operation of the controller 150 is not limited to the above as long as the controller 150 controls the piston 130 so that the pressure of the cavity does not exceed the pressure at which the pressing device 120 presses the submodule 1100.

Figure 7:
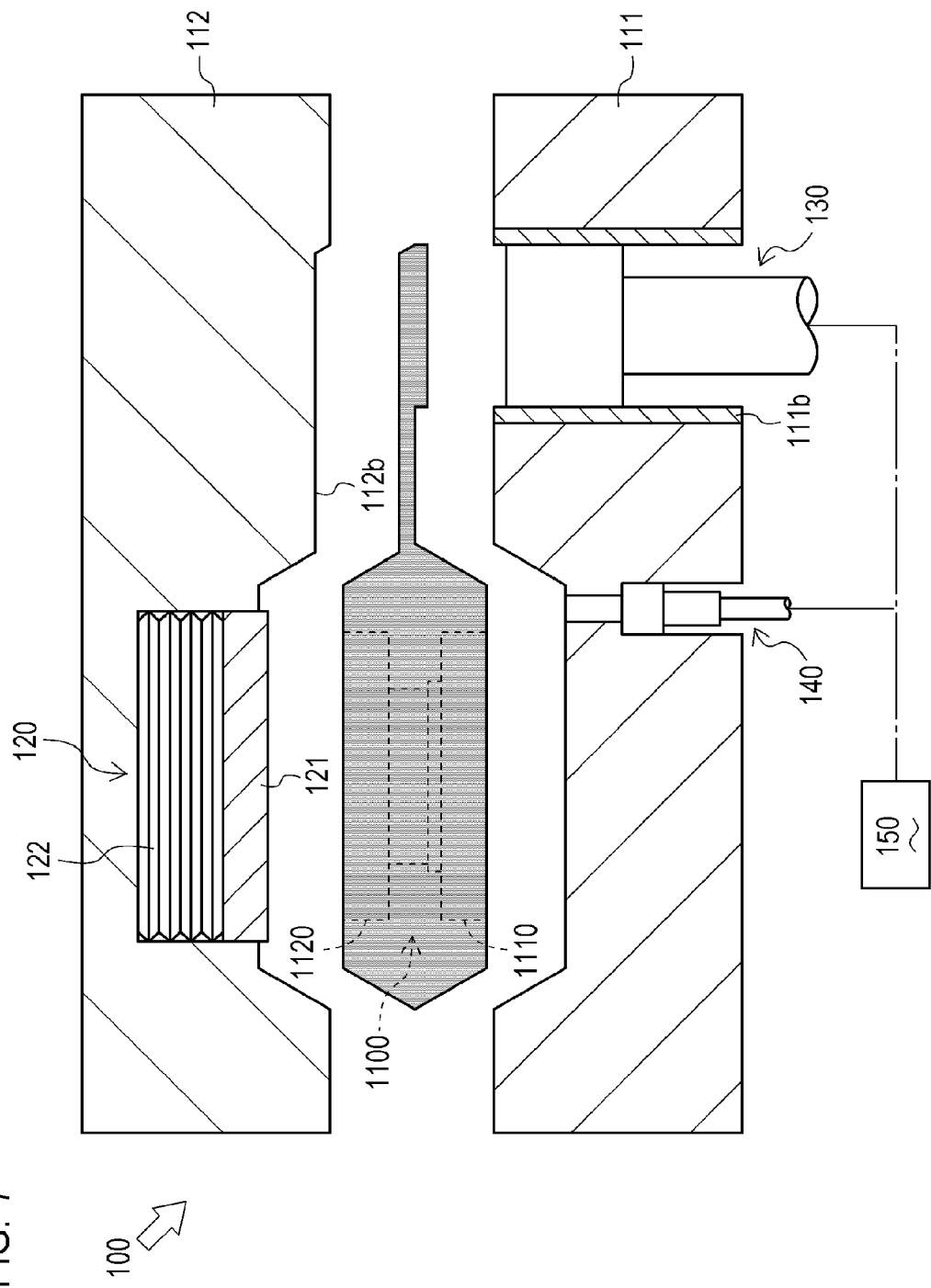
FIG. 7 shows how to take the submodule encapsulated with the encapsulating material out of the metal mold.

As shown in FIG. 7, when the resin R filling the cavity of the metal mold 110 cures, the upper mold 112 is moved away from the lower mold 111 to take the submodule 1100 encapsulated with the resin R out of the metal mold 110.

Finally, an unnecessary part (part cured in the groove 112b of the upper mold 112) of the cured resin R is removed, and thereby the semiconductor module 1000 can be obtained in which the heat-dissipating surface of the collector 1110 and the heat-dissipating surface of the emitter 1120 are not covered with the resin R.

In the present embodiment, the pocket 112c is formed in the recess 112a of the upper mold 112, and the pressing device 120 is arranged in the pocket 112c. However, a pocket 112cA may be formed in the recess 112a of the upper mold 112, and a sealing member 120A may be arranged in the pocket 112cA.

Figure 8:
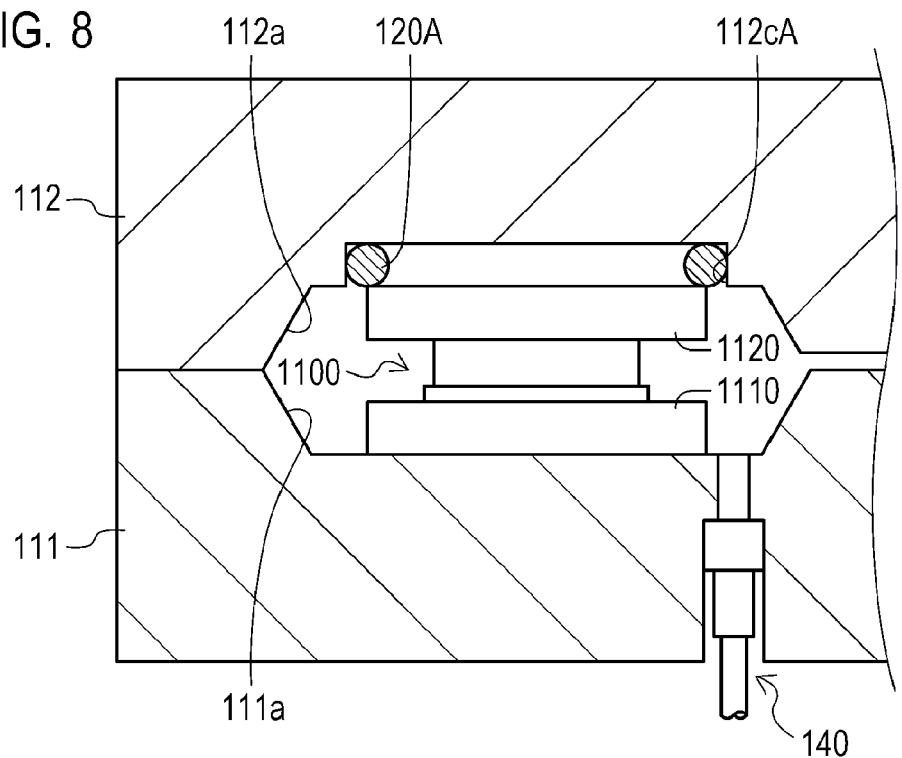
FIG. 8 shows another embodiment of a pressing device of the semiconductor module.

As shown in FIG. 8, the pocket 112cA is, similarly to the pocket 112c, formed so that the bottom surface of the recess 112a dents upward. The pocket 112cA has a vertical length smaller than that of the pocket 112c.

The sealing member 120A is an embodiment of a pressing device according to the present invention, and is an endless elastic member. The sealing member 120A presses the outer edge of the heat-dissipating surface (upper end surface) of the emitter 1120 when the metal mold 110 is closed.

Therefore, the sealing member 120A prevents the resin R from entering the pocket 112cA when the resin R is fed to the cavity of the metal mold 110.

This makes it possible to prevent the heat-dissipating surface of the emitter 1120 from being covered with the resin R.

As mentioned previously, the tablet-shaped resin R is previously softened, thus enabling to reduce the thrust of the piston 130. Therefore, it is possible to minimize a pressure at which the resin R presses the sealing member 120A, and consequently to prevent the heat-dissipating surface of the emitter 1120 from being covered with the resin R by use of only the sealing member 120A.

A pocket 112cB may be formed in the recess 112a of the upper mold 112, and a masking sheet 120B may be arranged in the pocket 112cB.

Figure 9:
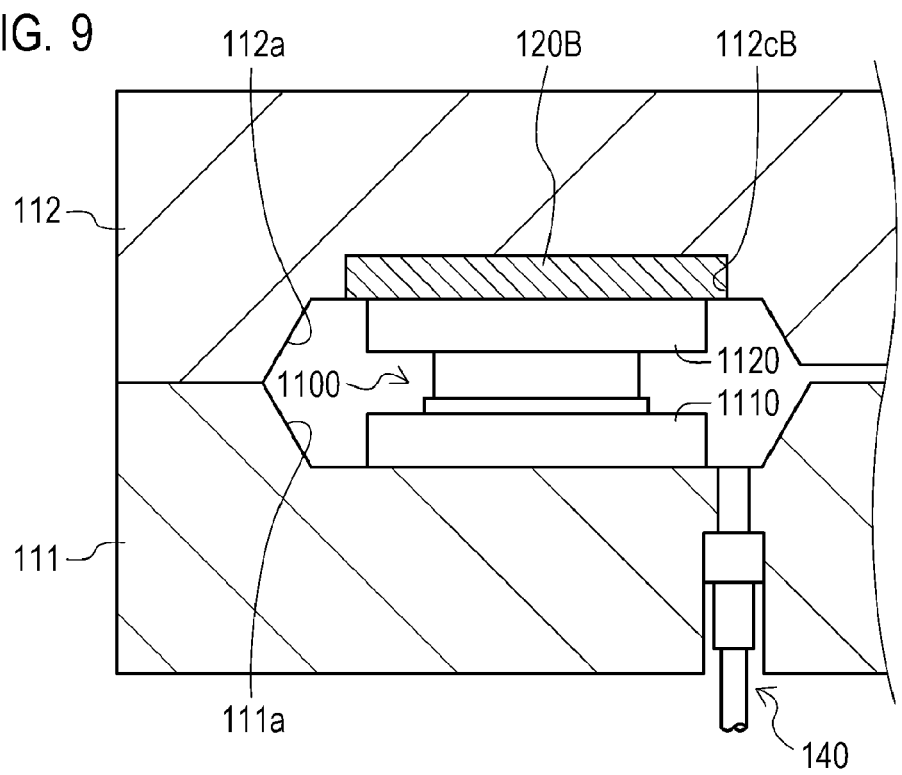
FIG. 9 shows another embodiment of a pressing device of the semiconductor module.

As shown in FIG. 9, the pocket 112cB is substantially similar in shape to the pocket 112cA.

The masking sheet 120B is an embodiment of a pressing device according to the present invention, and is an elastic member such as a sheet-like resin. When seen in a plan view, the masking sheet 120B has size larger than the heat-dissipating surface (upper end surface) of the emitter 1120. In other words, when seen in a plan view, the masking sheet 120B is formed to entirely cover the heat-dissipating surface of the emitter 1120. The masking sheet 120B closely comes in contact with the heat-dissipating surface of the emitter 1120 and presses the submodule 1100 downward when the metal mold 110 is closed.

This makes it possible to prevent the heat-dissipating surface of the emitter 1120 from being covered with the resin R.

Note that the masking sheet 120B has such stiffness that the semiconductor devices of the submodule 1100 are not damaged when the metal mold 110 is closed.

Moreover, the controller 150 controls the pressure of the cavity so that the resin R does not reach the heat-dissipating surface of the emitter 1120 due to the change in shape of the masking sheet 120B caused by the resin R when the cavity of the metal mold 110 is filled with the resin R.

In the present embodiment, as mentioned previously, the plurality of members (e.g., the collector 1110) constituting the submodule 1100 are joined to each other with joining material such as solder. However, since the pressing device 120 of the apparatus 100 can press the plurality of members constituting the submodule 1100 against each other, the plurality of members do not need to be joined with joining material such as solder.

[Second Embodiment]

Described below is an apparatus 200 for manufacturing a semiconductor module 2000, as a second embodiment of an apparatus for manufacturing a semiconductor module according to the present invention.

Figure 10A:
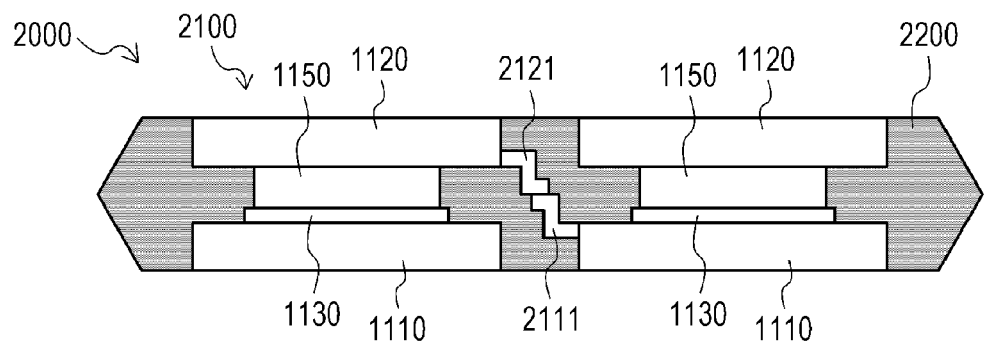
FIGS. 10A and 10B shows a submodule according to a second embodiment of the present invention.
Figure 10B:
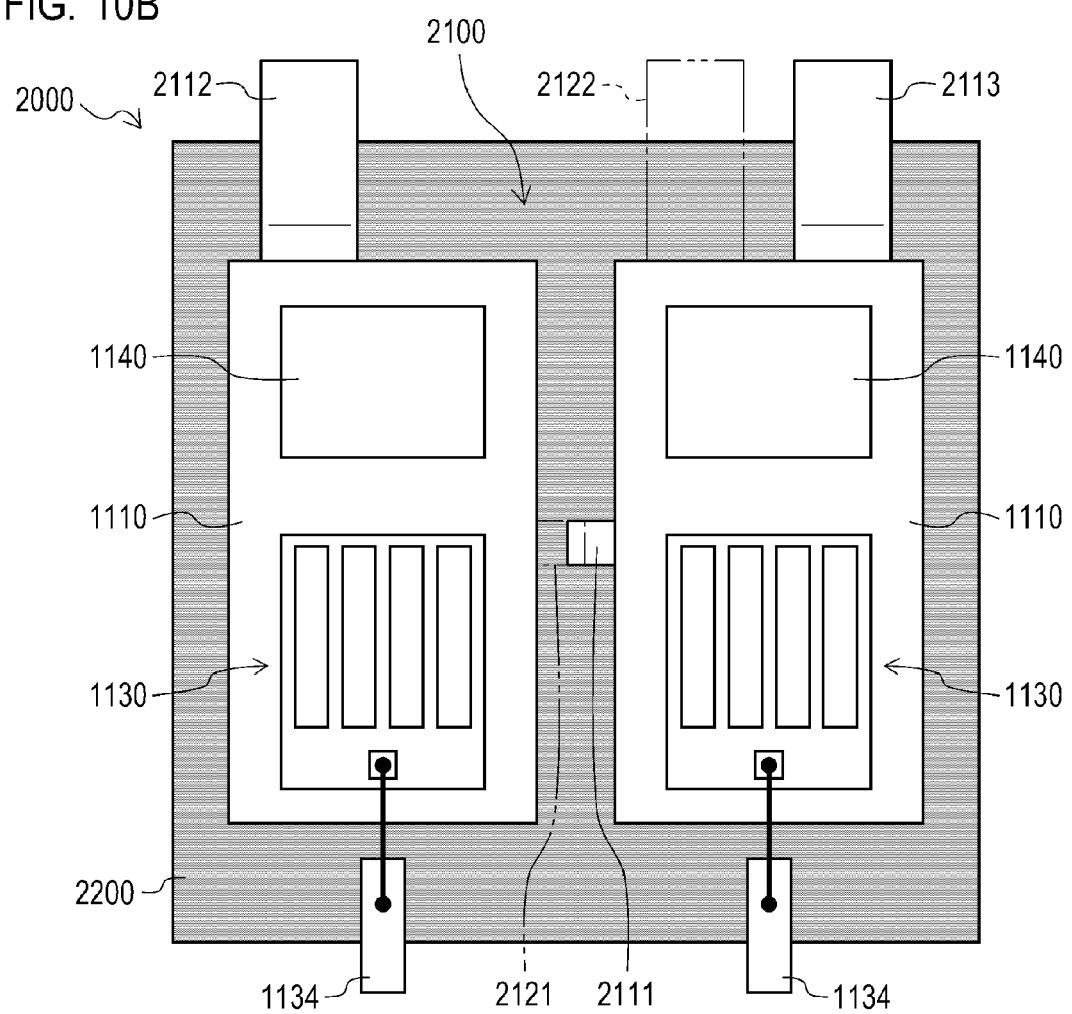

First, with reference to FIGS. 10A and 10B, the structure of the semiconductor module 2000 is described.

The semiconductor module 2000 is what is called a 2-in-1 type intelligent power module. The semiconductor module 2000 is used for controlling a motor of a hybrid vehicle, for example.

Hereinafter, the same parts of the semiconductor module 2000 as the semiconductor module 1000 are each indicated by the same reference sign, and descriptions thereof are omitted unless otherwise specified.

As shown in FIGS. 10A and 10B, the semiconductor module 2000 includes a submodule 2100 and an encapsulating part 2200.

The submodule 2100 has a structure such that the submodule 1100 of the semiconductor module 1000 is connected to another submodule 1100.

The submodule 2100 has two collectors 1110, two emitters 1120, two transistors 1130, two diodes 1140, two first spacers 1150, and two second spacers 1160 (not shown).

One collector 1110 and one emitter 1120 (the collector 1110 and the emitter 1120 on the left side in FIGS. 10A and 10B) are arranged at a predetermined interval with respect to the other collector 1110 and the other emitters 1120 (the collector 1110 and the emitter 1120 on the right side in FIGS. 10A and 10B).

The one emitter 1120 has a connecting part 2121 extending toward the other collector 1110.

The other collector 1110 has a connecting part 2111 extending toward the one emitter 1120.

The connecting part 2121 and the connecting part 2111 are connected to each other. Through the connecting part 2121 and the connecting part 2111, the one emitter 1120 and the other collector 1110 are electrically connected to each other.

The one collector 1110 has a collector terminal 2112 for electrically connecting the one collector 1110 to the outside, the collector terminal 2112 protrudes outward of the encapsulating part 2200.

The other emitter 1120 has an emitter terminal 2122 for electrically connecting the other emitter 1120 to the outside, the emitter terminal 2122 protrudes outward of the encapsulating part 2200.

The other collector 1110 has an output terminal 2113 for electrically connecting the other collector 1110 to the outside, the output terminal 2113 protrudes outward of the encapsulating part 2200.

The encapsulating part 2200 encapsulates the submodule 2100. Specifically, the encapsulating part 2200 holds the submodule 2100 thereinside so that the heat-dissipating surfaces of the collectors 1110 and that the heat-dissipating surfaces of the emitters 1120 are exposed, and that the tip of the collector terminal 2112, the tip of the emitter terminal 2122, the tip of the output terminal 2113 and the tips of the gate terminals 1134 are exposed.

Figure 11:
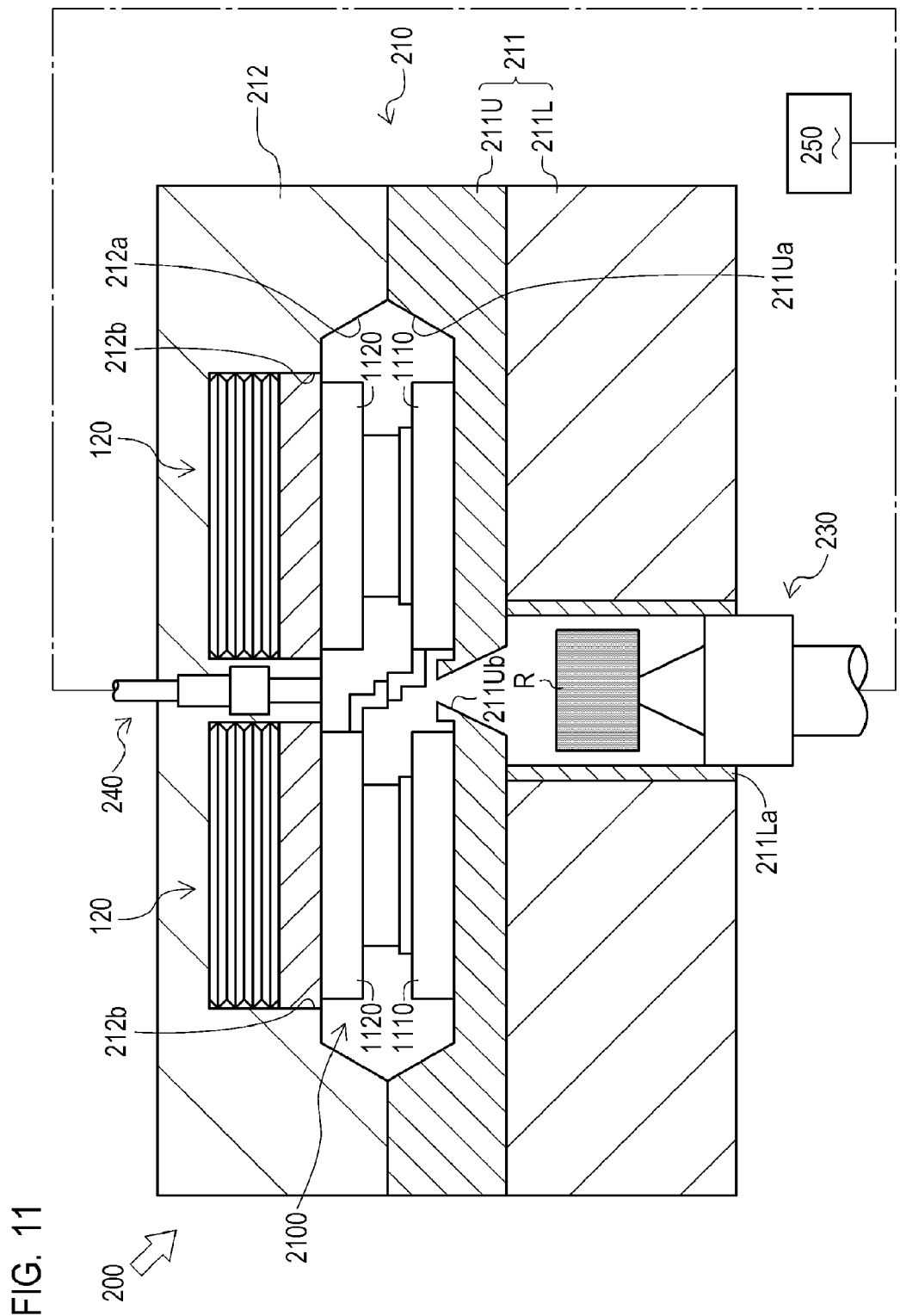
FIG. 11 shows an apparatus for manufacturing a semiconductor module according to the second embodiment of the present invention.
Figure 12:
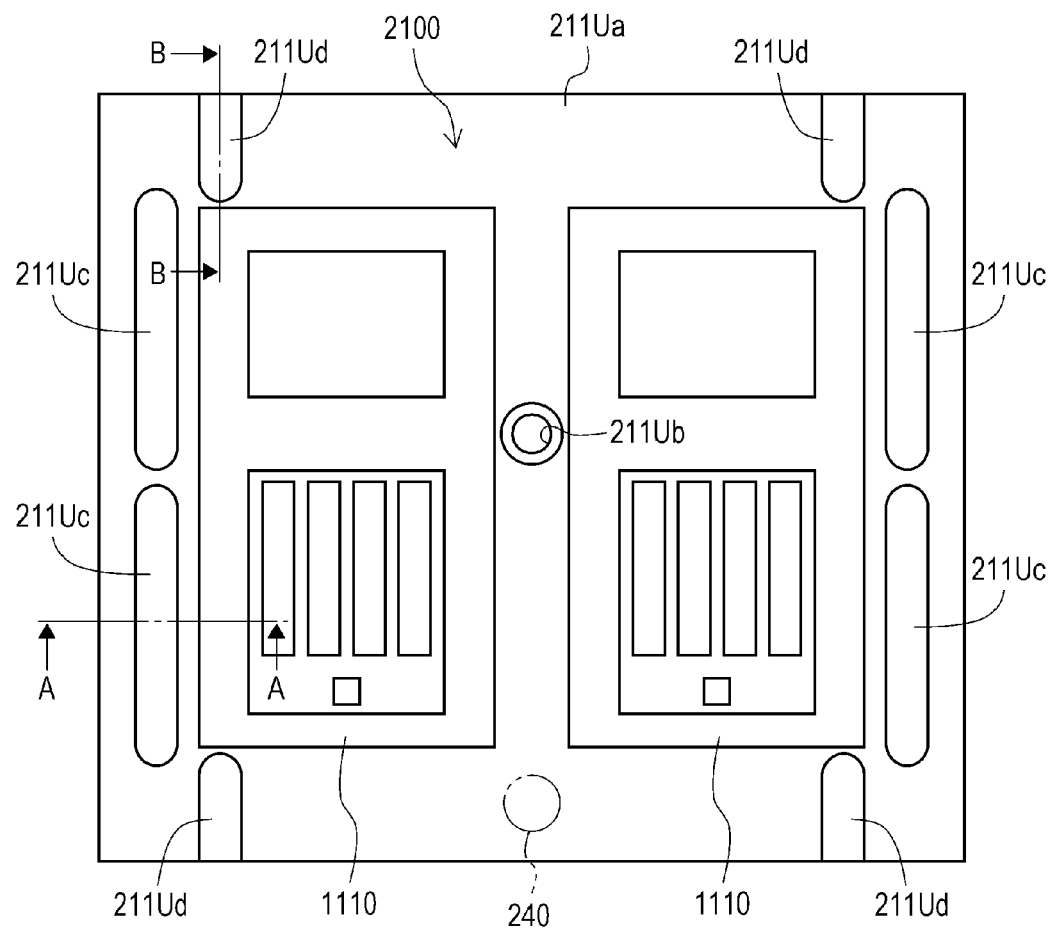
FIG. 12 is a plan view showing a cavity of a metal mold of the apparatus.

Next, with reference to FIGS. 11 to 13, the structure of the apparatus 200 is described.

The apparatus 200 manufactures the semiconductor module 2000.

For convenience, the vertical direction in FIG. 11 is defined as a vertical direction of the apparatus 200, and the horizontal direction in FIG. 1 is defined as a horizontal direction of the apparatus 200. In addition, this side in FIG. 11 is defined as a front side of the apparatus 200, and the other side in FIG. 11 is defined as a rear side of the apparatus 200.

The horizontal direction in FIG. 12 corresponds to the horizontal direction of the apparatus 200. In addition, the lower side and the upper side in FIG. 12 correspond to the front side and the rear side of the apparatus 200, respectively.

Hereinafter, the same parts of the apparatus 200 as the apparatus 100 are each indicated by the same reference sign, and descriptions thereof are omitted unless otherwise specified.

As shown in FIG. 11, the apparatus 200 includes a metal mold 210, two pressing devices 120, a piston 230, a pressure sensor 240, and a controller 250.

The metal mold 210 consists of a lower mold 211 and an upper mold 212. Inside the metal mold 210, heaters (not shown) for heating the metal mold 210 are arranged. When the metal mold 210 is closed, a cavity which is a space for molding the encapsulating part 2200 of the semiconductor module 2000 is formed inside the metal mold 210. The cavity of the metal mold 210 is situated in the middle in the horizontal direction. The cavity of the metal mold 210 has a vertical length substantially equal to that of the submodule 2100. The submodule 2100 is arranged in the cavity of the metal mold 210, and then the resin R is fed to the cavity.

The lower mold 211 consists of a lower layer 211L and an upper layer 211U.

The lower layer 211L constituting the lower part of the lower mold 211, and is fixed at a predetermined position. Inside the lower layer 211L, a cylinder 211La is arranged. Specifically, in the middle of the lower layer 211L in the horizontal direction, a cylindrical through-hole penetrating through the lower layer 211L in the vertical direction is formed. The cylinder 211La is fitted into the through-hole.

The cylinder 211La is a member formed in a circular cylinder. Inside the cylinder 211La, the piston 230 is arranged in a slidable manner. The structure of the piston 230 is described later.

The upper layer 211U constituting the upper part of the lower mold 211, and is configured to move into and out of proximity with the lower layer 211L. On the upper surface of the upper layer 211U, a recess 211Ua is formed which constitutes the lower portion of the cavity of the metal mold 210.

The recess 211Ua is formed so that the middle in the horizontal direction of the upper surface of the upper layer 211U dents downward. The bottom surface (lower surface) of the recess 211Ua is formed as a flat surface extending in the horizontal direction.

Inside the upper layer 211U, a gate hole 211Ub is formed.

The gate hole 211Ub penetrates through the upper layer 211U in the vertical direction. The gate hole 211Ub is formed in a circular truncated cone whose diameter gradually decreases toward the upper side. The gate hole 211Ub is formed so that the inside of the cylinder 211La and the cavity of the metal mold 210 communicate with each other when the metal mold 210 is closed. In other words, the cavity which is a space inside the metal mold 210 and the outside of the metal mold 210 communicate with each other through the gate hole 211Ub and the cylinder 211La. The upper end of the gate hole 211Ub is situated slightly above the bottom surface of the recess 211Ua. Specifically, on the bottom surface of the recess 211Ua, a protrusion which slightly protrudes upward is formed, and the gate hole 211Ub acting as a hole through which the resin R is supplied opens on the upper end surface of the protrusion.

As shown in FIG. 12, when seen in a plan view, the gate hole 211Ub is formed in substantially the center of the recess 211Ua. In other words, the gate hole 211Ub is situated in substantially the middle in the front-rear direction of the recess 211Ua and in substantially the middle in the horizontal direction of the recess 211Ua.

Note that, in FIG. 12, for convenience, some parts of the submodule 2100 are not shown.

On the bottom surface of the recess 211Ua, the submodule 2100 is placed. The submodule 2100 is placed so that the gate hole 211Ub is situated between the collectors 1110 and that the collectors 1110 are arranged in the horizontal direction. In addition, the submodule 2100 is placed so that the heat-dissipating surfaces of the collectors 1110 closely come in contact with the bottom surface of the recess 211Ua.

On the bottom surface of the recess 211Ua, four first lower weirs 211Uc and four second lower weirs 211Ud are formed. These weirs are used for limiting the flow of the resin R.

Figure 13A:
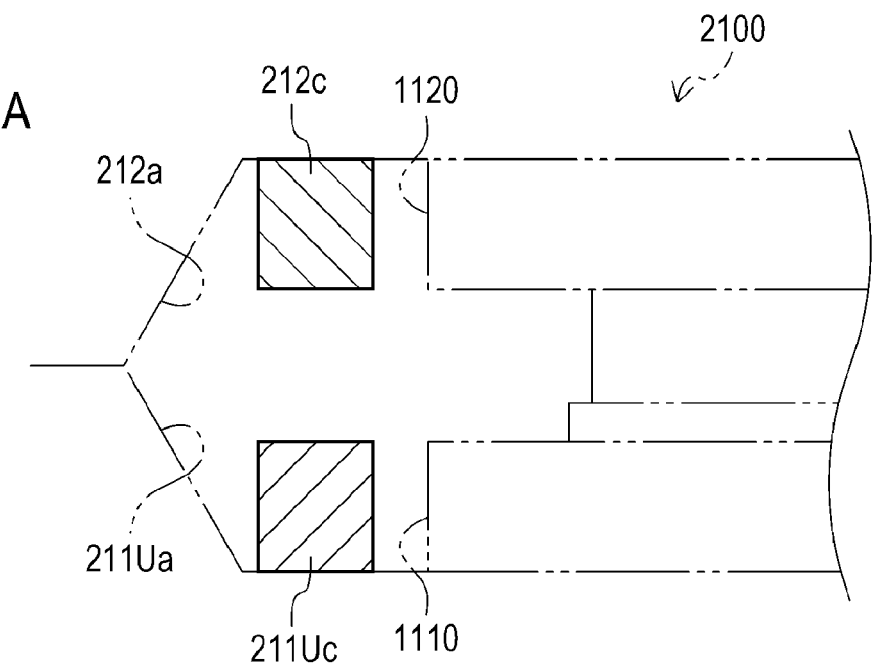
FIGS. 13A and 13B shows weirs formed in the metal mold.

As shown in FIG. 12 and FIG. 13A, the first lower weir 211Uc extends in the front-rear direction, and protrudes upward from the bottom surface of the recess 211Ua. The first lower weir 211Uc has a vertical length substantially equal to that of the collector 1110. Note that FIG. 13A is a sectional view taken along line A-A in FIG. 12. To the left of the left collector 1110, two of the first lower weirs 211Uc are arranged at a slight interval in the front-rear direction from the vicinity of the front end to the vicinity of the rear end of the recess 211Ua. To the right of the right collector 1110, the other first lower weirs 211Uc are arranged at a slight interval in the front-rear direction from the vicinity of the front end to the vicinity of the rear end of the recess 211Ua.

Figure 13B:
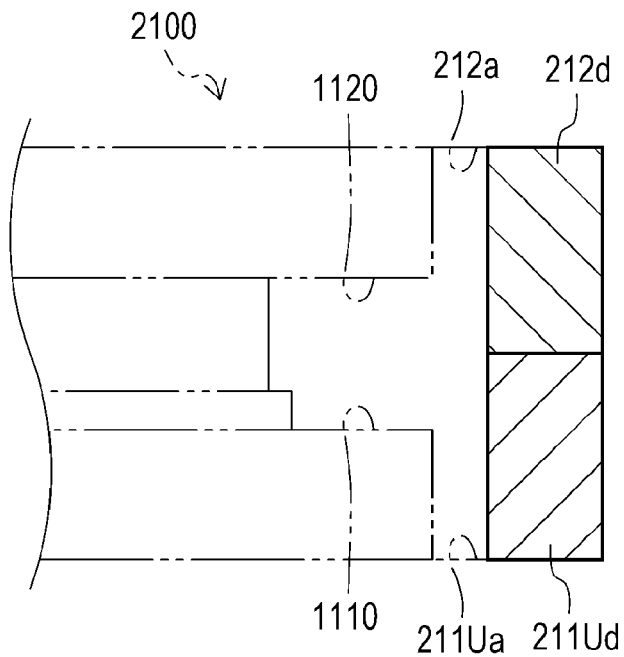

As shown in FIG. 12 and FIG. 13B, the second lower weir 211Ud extends in the front-rear direction, and protrudes upward from the bottom surface of the recess 211Ua. The second lower weir 211Ud has a vertical length which is half of the vertical length of the cavity of the metal mold 210, and comes in contact with after-mentioned second upper weir 212d. Note that FIG. 13B is a sectional view taken along line B-B in FIG. 12. To the rear of the left end portion of the left collector 1110, one of the second lower weirs 211Ud is arranged from the rear end of the recess 211Ua to the vicinity of the rear end of the left collector 1110. To the front of the left end portion of the left collector 1110, another second lower weir 211Ud is arranged from the front end of the recess 211Ua to the vicinity of the front end of the left collector 1110. To the rear of the right end portion of the right collector 1110, another second lower weir 211Ud is arranged from the rear end of the recess 211Ua to the vicinity of the rear end of the right collector 1110. To the front of the right end portion of the right collector 1110, the other second lower weir 211Ud is arranged from the front end of the recess 211Ua to the vicinity of the front end of the right collector 1110.

As shown in FIG. 11, the upper mold 212 is configured to move into and out of proximity with the lower mold 211. On the lower surface of the upper mold 212, a recess 212a is formed which constitutes the upper portion of the cavity of the metal mold 210.

The recess 212a is formed so that the middle in the horizontal direction of the lower surface of the upper mold 212 dents upward. In other words, the recess 212a is formed to coincide in position with the recess 211Ua of the upper layer 211U of the lower mold 211.

On the bottom surface (upper surface) of the recess 212a of the upper mold 212, two pockets 212b accommodating the pressing devices 120 are formed.

Each of the pockets 212b is substantially similar in structure to the pocket 112c formed in the upper mold 112 of the apparatus 100. The pockets 212b are arranged at a predetermined interval so as to coincide in position with the emitters 1120 of the submodule 2100 placed in the cavity of the metal mold 210.

On the bottom surface of the recess 212a of the upper mold 212, four first upper weirs 212c and four second upper weirs 212d are formed (not shown). These weirs are used for limiting the flow of the resin R, similarly to the weirs of the lower mold 211. The first upper weirs 212c correspond to the first lower weirs 211Uc. The first upper weirs 212c are substantially similar in shape to the first lower weirs 211Uc, and are arranged to face the first lower weirs 211Uc. The second upper weirs 212d correspond to the second lower weirs 211Ud. The second upper weirs 212d are substantially similar in shape to the second lower weirs 211Ud, and are arranged to face the second lower weirs 211Ud.

As shown in FIG. 13B, the first upper weir 212c protrudes downward from the bottom surface of the recess 212a. The first upper weir 212c has a vertical length substantially equal to that of the emitter 1120.

The second upper weir 212d protrudes downward from the bottom surface of the recess 212a. The second upper weir 212d has a vertical length which is half of the vertical length of the cavity of the metal mold 210, and comes in contact with the second lower weir 211Ud.

As shown in FIG. 11, when the metal mold 210 is closed, the pressing devices 120 press the submodule 2100 at a predetermined pressure from above while covering the heat-dissipating surfaces of the emitters 1120. A pressure at which the pressing devices 120 press the submodule 2100 is set to such a value that semiconductor devices (the transistors 1130 and the diodes 1140) of the submodule 2100 are not damaged.

Instead of the two pressing devices 120, one pressing device capable of pressing the two emitters 1120 at the same time may be provided.

The piston 230 is a member for feeding the resin R to the cavity of the metal mold 210. The piston 230 slides in the vertical direction inside the cylinder 211La. The piston 230 is electrically connected to the controller 250, and is controlled by the controller 250. Specifically, the piston 230 is operated by a servo motor, and the servo motor is controlled by the controller 250. The piston 230 differs from the piston 130 of the apparatus 100 in that the tip (upper end portion) of the piston 230 is formed in a circular truncated cone. Specifically, the tip of the piston 230 is formed in a circular truncated cone whose diameter gradually decreases toward the upper side so as to fit the gate hole 211Ub.

The pressure sensor 240 is used for measuring a pressure of the cavity of the metal mold 210 and is substantially similar in structure to the pressure sensor 140 of the apparatus 100. The pressure sensor 240 is electrically connected to the controller 250.

The pressure sensor 240 is arranged inside the upper mold 212 so as to be exposed from the portion of the bottom surface (upper surface) of the recess 212a, where the pockets 212b is not formed. Specifically, as shown in FIGS. 11 and 12, the pressure sensor 240 is arranged to the front of the submodule 2100 placed in the cavity of the metal mold 210, and in the middle in the horizontal direction of the upper mold 212.

The controller 250 is electrically connected to the piston 230 and the pressure sensor 240. The controller 250 controls the piston 230 based on the pressure of the cavity measured by the pressure sensor 240. In other words, the controller 250 controls the piston 230 so that the pressure of the cavity is a predetermined value.

Note that since the manner of the operation of the controller 250 is similar to that of the controller 150 of the apparatus 100, a detailed explanation thereof is omitted.

With reference to FIGS. 14 to 17, described below is a step for manufacturing the semiconductor module 2000, as a second embodiment of a method for manufacturing a semiconductor module according to the present invention.

The step for manufacturing the semiconductor module 2000 includes manufacturing the semiconductor module 2000 by use of the apparatus 200.

Figure 14:
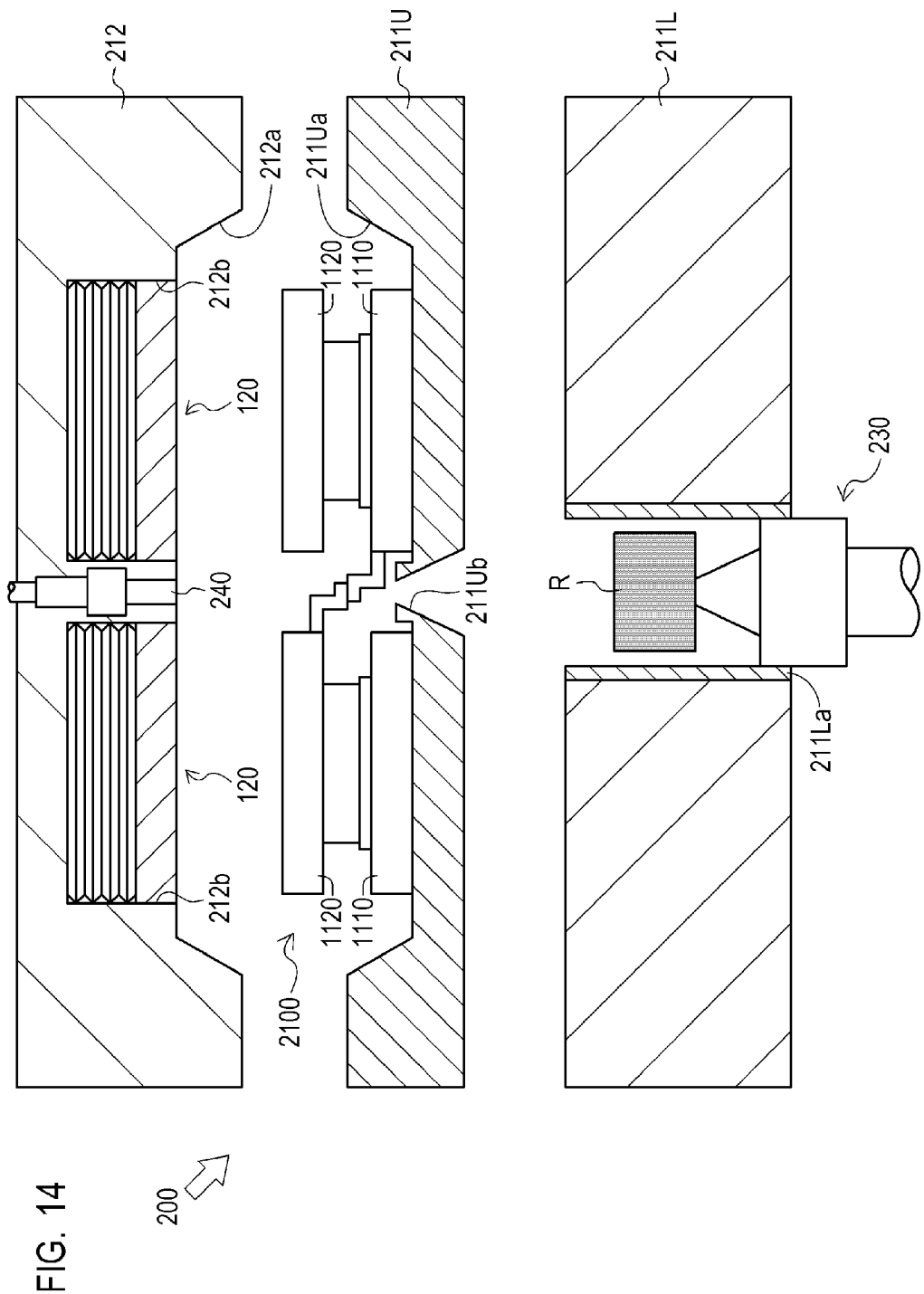
FIG. 14 shows a situation where the metal mold of the apparatus opens.

First, as shown in FIG. 14, in the step for manufacturing the semiconductor module 2000, the upper mold 212 is moved away from the lower mold 211, and the upper layer 211U of the lower mold 211 is moved away from the lower layer 211L.

At this time, the metal mold 210 is heated by the heaters arranged therein to such a temperature (e.g., 150 to 200° C.) that the tablet-shaped resin R is molten and that the molten resin R is cured with time.

Next, the submodule 2100 is placed on the recess 211Ua so that the heat-dissipating surfaces (lower end surfaces) of the collectors 1110 closely come in contact with the bottom surface (lower surface) of the recess 211Ua.

At this time the submodule 2100 is heated to temperature substantially equal to that of the metal mold 210 in view of variation in size of the submodule 2100 by thermal expansion.

Then, in a state where the piston 230 is at the lowest position, the tablet-shaped resin R is placed on the tip of the piston 130.

At this time, the tablet-shaped resin R is heated to a temperature (e.g., 90° C.) at which the tablet-shaped resin R is soften so as to be held.

Then, the upper layer 211U is downward moved until the lower surface of the upper layer 211U comes in contact with the upper surface of the lower layer 211L, and the upper mold 212 is downward moved until the lower surface of the upper mold 212 comes in contact with the upper surface of the upper layer 211U, thereby the metal mold 210 being closed.

At this time, the pressing devices 120 entirely cover the heat-dissipating surfaces (upper end surfaces) of the emitters 1120, and press the submodule 2100 downward. In other words, the submodule 2100 is sandwiched between the pressing devices 120 and the recess 211Ua of the upper layer 211U of the lower mold 211 from above and below, and thereby the heat-dissipating surfaces of the collectors 1110 and the heat-dissipating surfaces of the emitters 1120 are entirely masked by the recess 211Ua and the pressing devices 120, respectively.

Then, when the piston 230 is upward moved, the softened tablet-shaped resin R comes in contact with the upper layer 211U of the lower mold 211 and melts.

At this time, the molten resin R is fed to the cavity of the metal mold 210 through the gate hole 211Ub.

As mentioned previously, the tablet-shaped resin R is previously softened, which enables the resin R to suitably flow so as to be fed to the cavity of the metal mold 210 even if the thrust of the piston 230 becomes low.

Figure 15:
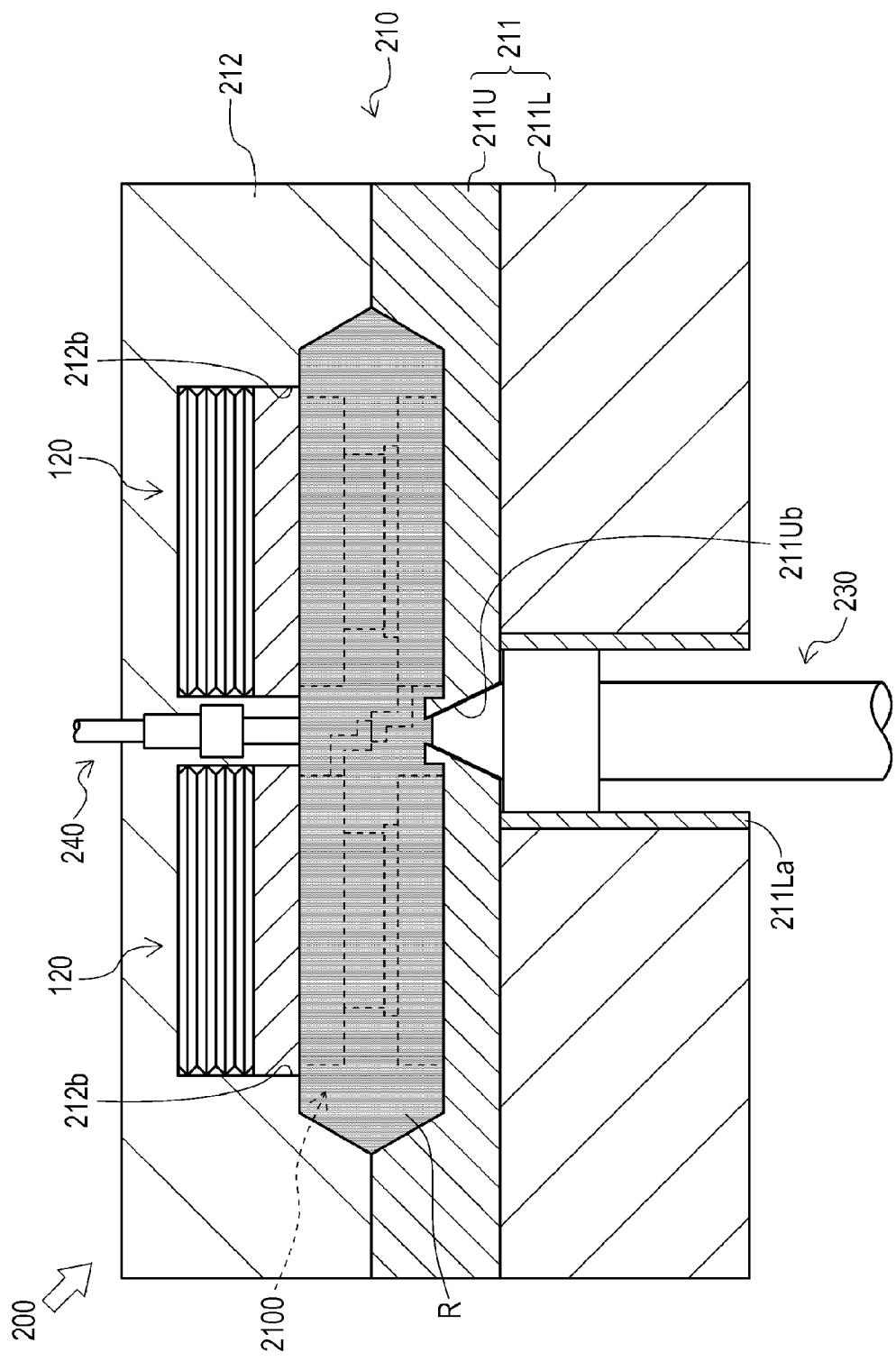
FIG. 15 shows a situation where the cavity is filled with the encapsulating material.

As show in FIG. 15, the piston 230 is further upward moved to fill the cavity of the metal mold 210 with the resin R.

At this time, since the tip of the piston 230 is formed along the shape of the gate hole 211Ub, the tip is fitted into the gate hole 211Ub.

Figure 16:
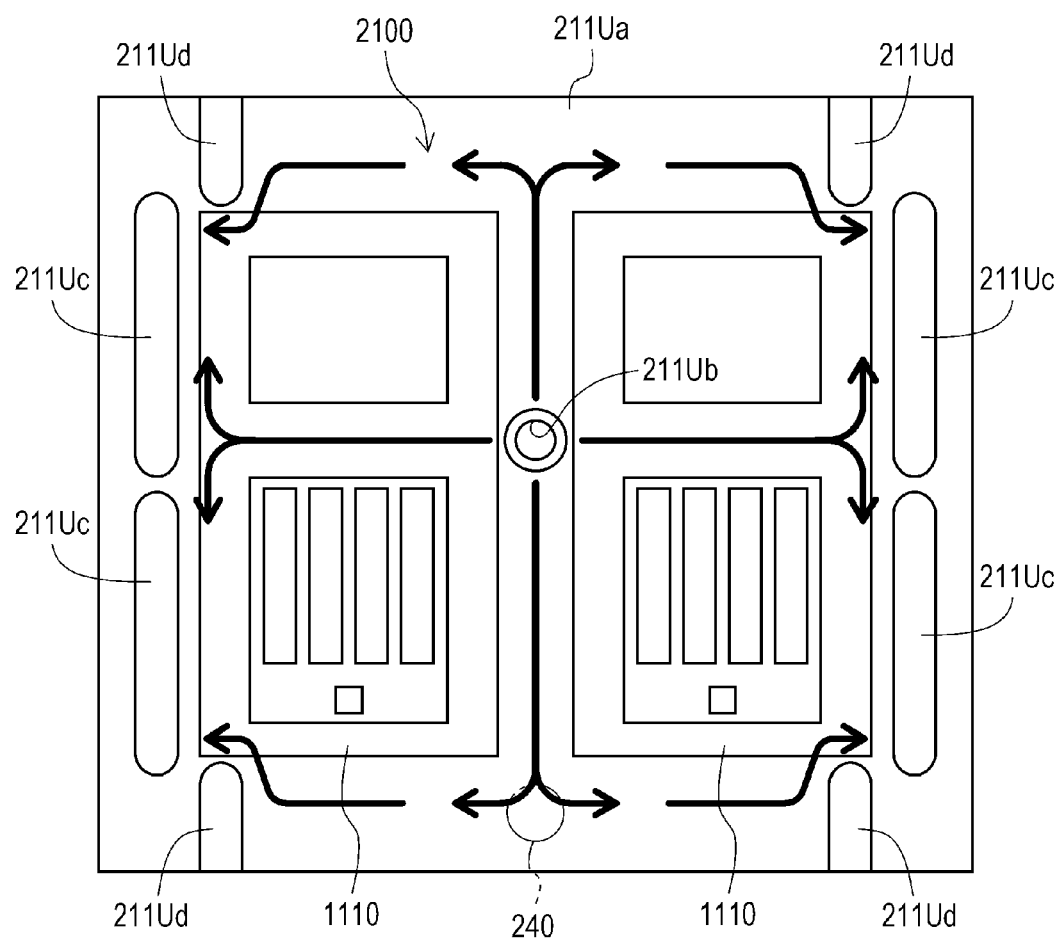
FIG. 16 shows a flow of the encapsulating material fed into the cavity.

As show in FIG. 16, when seen in a plan view, the gate hole 211Ub is situated in substantially the center of the recess 211Ua. Therefore, the resin R fed to the cavity of the metal mold 210 flows from the center of the cavity toward the outside. The resin R having flowed into the space between the one collector 1110 and the one emitter 1120, and the space between the other collector 1110 and the other emitter 1120 flows in the horizontal direction at low velocity because the path through which the resin R flows is relatively narrow (see arrows extending in the horizontal direction from the gate hole 211Ub in FIG. 16).

On the other hand, the resin R having flowed into the space between the collectors 1110 and the space between the emitters 1120 flows in the front-rear direction at high velocity because the path through which the resin R flows is relatively wide (see arrows extending in the vertical direction from the gate hole 211Ub in FIG. 16).

The first lower weirs 211Uc and the first upper weirs 212c (not shown) restrain the resin R having flowed in the horizontal direction from the gate hole 211Ub from flowing to the right and left ends of the cavity. As a result, the resin R having flowed in the horizontal direction from the gate hole 211Ub is divided into two flows frontward and rearward, and then flow between the one collector 1110 and the one emitter 1120, and between the other collector 1110 and the other emitter 1120.

On the other hand, the resin R having flowed in the front-rear direction from the gate hole 211Ub divides into two flows rightward and leftward, and then bumps against the second lower weirs 211Ud and the second upper weirs 212d (not shown), thereby slowing down.

After the space around the semiconductor devices in the submodule 2100, namely, the space between the one collector 1110 and the one emitter 1120, and the space between the other collector 1110 and the other emitter 1120 are filled with the resin R, the resin R having flowed leftward from the gate hole 211Ub passes through the space between the first lower weirs 211Uc on the left side and the space between the first upper weirs 212c on the left side to flow to the left end of the cavity, and the resin R having flowed rightward from the gate hole 211Ub passes through the space between the first lower weirs 211Uc on the right side and the space between the first upper weirs 212c on the right side to flow to the right end of the cavity. In addition, the resin R having flowed rearward from the gate hole 211Ub passes through the space among the submodule 2100, the second lower weirs 211Ud and the second upper weirs 212d on the rear side to flow to the right and left ends of the cavity, and the resin R having flowed frontward from the gate hole 211Ub passes through the space among the submodule 2100, the second lower weirs 211Ud and the second upper weirs 212d on the front side to flow to the right and left ends of the cavity.

Thus, the resin R fed to the cavity of the metal mold 210 from the gate hole 211Ub divides into some flows, and finally gathers in the outer end of the cavity.

As mentioned previously, in the apparatus 200, when seen in a plan view, the gate hole 211Ub is situated in substantially the center of the recess 211Ua. Therefore, the resin R flows from the inside toward the outside of the cavity, and portions where the resin R gathers are situated in the outer end of the cavity.

This makes it possible to restrain foams from remaining in the vicinity of the semiconductor device in the submodule 2100 when the resin R cures.

Moreover, in the apparatus 200, a plurality of weirs restrains the resin R from flowing toward the outside of the cavity.

This makes it possible to reliably situate the portions where the resin R gathers in the outer end of the cavity.

Therefore, it is possible to further restrain foams from remaining in the vicinity of the semiconductor device in the submodule 2100 when the resin R cures.

In the present embodiment, the four first lower weirs 211Uc, the four second lower weirs 211Ud, the four first upper weirs 212c, and the four second upper weirs 212d are provided. However, no weirs may be provided.

Figure 17:
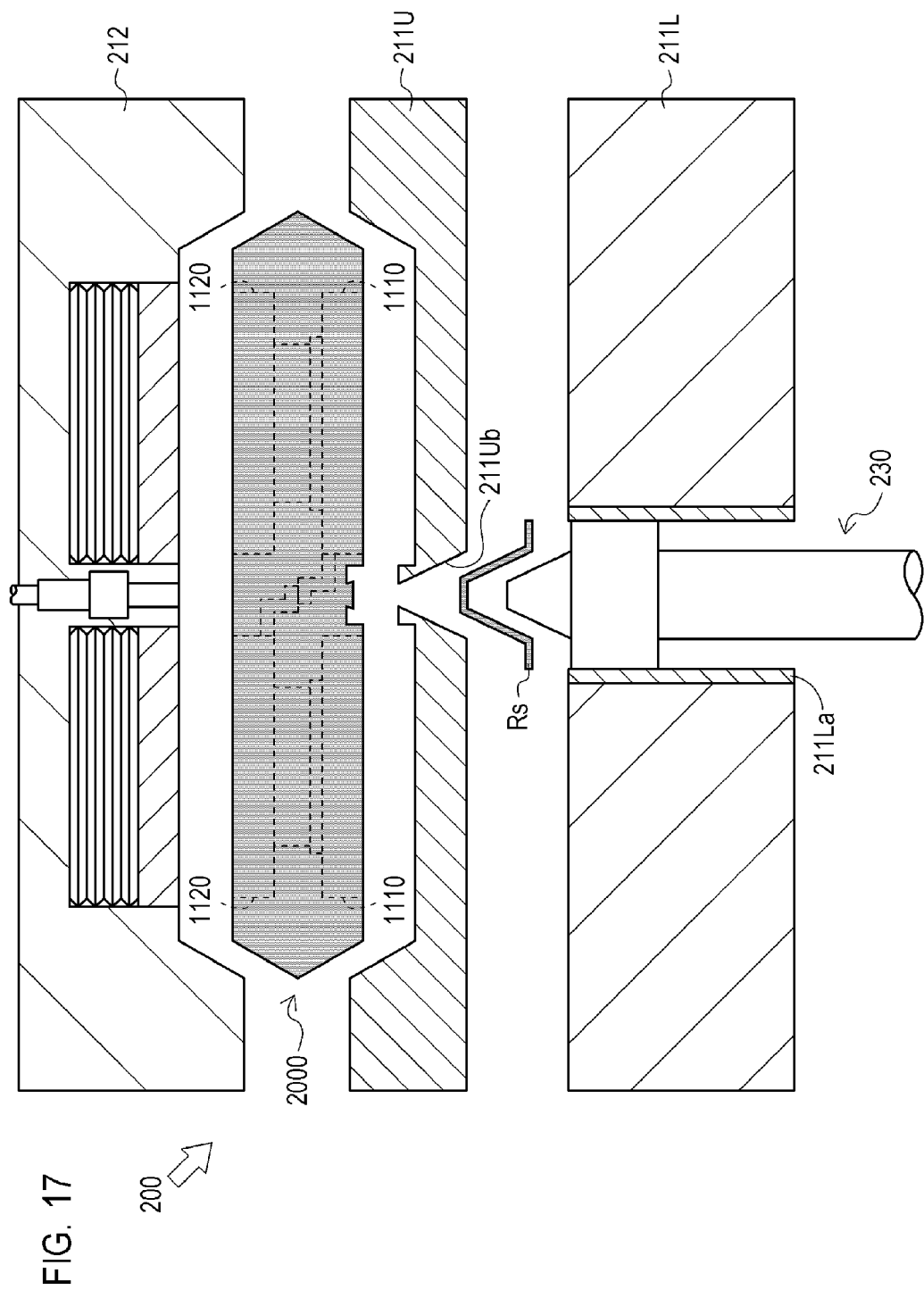
FIG. 17 shows how to take the semiconductor module out of the metal mold.

As shown in FIG. 17, when the resin R filling the cavity of the metal mold 210 cures, the upper mold 212 is moved away from the lower mold 211, and the upper layer 211U of the lower mold 211 is moved away from the lower layer 211L.

At this time, the resin R remaining in the cylinder 211La and the gate hole 211Ub is automatically cut off as an unnecessary part Rs.

As mentioned previously, since the upper end of the gate hole 211Ub is situated slightly above the bottom surface of the recess 211Ua, the resin R having encapsulated the submodule 2100 does not protrude downward from the heat-dissipating surfaces of the collectors 1110 when the unnecessary part Rs is cut off.

This makes it possible to omit removing a part of the resin R having encapsulated the submodule 2100.

In this manner, the semiconductor module 2000 in which the heat-dissipating surfaces of the collectors 1110 and the heat-dissipating surfaces of the emitters 1120 are not covered with the resin R can be obtained.

REFERENCE SIGNS LIST

100: semiconductor module
110: metal mold
111: lower mold
111*a*: recess
112: upper mold
112*a*: recess
112*b*: groove
112*c*: pocket
120: pressing device
121: sliding member
122: elastic member
130: piston
140: pressure sensor
150: controller
1000: semiconductor module
1100: submodule
1110: collector
1120: emitter
1130: transistor
1140: diode
1200: encapsulating part

What is claimed is:

1. A method for manufacturing a semiconductor module including a submodule having at least one switching element, and at least one pair of plate electrodes between which the switching element is sandwiched, in which two heat-dissipating surfaces for releasing heat of the switching element are formed on two surfaces opposite to two surfaces facing the switching element in the pair of electrodes, the method comprising:

a first step of preparing: (i) a lower mold and an upper mold between which a cavity is formed when the lower mold and the upper mold are closed, (ii) a pressing device configured to press one of the two heat-dissipating surfaces, and which is arranged in one of the lower mold and the upper mold, (iii) a pressure measuring device which measures a pressure of the cavity, and (iv) a piston which feeds an encapsulating material for encapsulating the submodule to the cavity;

a second step of placing the submodule in the cavity so that the submodule is pressed by the pressing device while covering a first one of the two heat-dissipating surfaces with the pressing device and covering a second one of the two heat-dissipating surfaces with the other of the lower mold and the upper mold; and a third step of feeding the encapsulating material to the cavity by moving the piston so that the pressure of the cavity measured by the pressure measuring device does not exceed a pressure at which the pressing device presses the submodule, wherein the lower mold has a plurality of lower weirs restraining the encapsulating material from flowing toward an outside of the cavity, the lower weirs protruding from a recess of the lower mold, and the upper mold has a plurality of upper weirs restraining the encapsulating material from flowing toward the outside of the cavity, the upper weirs protruding from a recess of the upper mold and being arranged to face the lower weirs when the lower mold and the upper mold are closed.

2. The method according to claim 1, wherein
in the third step, a velocity of the piston is reduced before the cavity is completely filled with the encapsulating material.

3. The method according to claim 1, wherein
the submodule has two switching elements, and two pairs of plate electrodes between which the two switching elements are respectively sandwiched, the two switching elements being arranged adjacent to each other, seen in a plan view, and in the third step, the encapsulating material is fed to the cavity so as to flow from a center of the cavity toward the outside of the cavity, seen in the plan view.

4. The method according to claim 1, wherein
the pressing device has a sliding member sliding in a direction in which the pressing device presses the submodule and closely coming in contact with one of the two heat-dissipating surfaces, and an elastic member forcing the sliding member in the direction in which the pressing device presses the submodule.

5. The method according to claim 1, wherein
the pressing device has an elastic member closely coming in contact with an outer edge of one of the two heat-dissipating surfaces.

6. The method according to claim 1, wherein
the pressing device has an elastic member closely coming in contact with one of the two heat-dissipating surfaces.

* * * * *